United States Patent
Shimizu et al.

(10) Patent No.: US 6,817,735 B2
(45) Date of Patent: Nov. 16, 2004

(54) ILLUMINATION LIGHT SOURCE

(75) Inventors: Masanori Shimizu, Kyotanabe (JP);
Yoko Shimomura, Ikoma (JP); Hideo Nagai, Takatsuki (JP); Tetsushi Tamura, Takatsuki (JP); Nobuyuki Matsui, Uji (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 23 days.

(21) Appl. No.: 10/154,377

(22) Filed: May 23, 2002

(65) Prior Publication Data

US 2003/0063462 A1 Apr. 3, 2003

(30) Foreign Application Priority Data

May 24, 2001 (JP) .................................. 2001-155628
Dec. 14, 2001 (JP) .................................. 2001-382193

(51) Int. Cl.$^7$ .............................................. F21V 9/00
(52) U.S. Cl. .................... 362/231; 362/545; 362/555; 362/800; 362/295; 313/512; 267/85
(58) Field of Search ................ 362/231, 545, 362/555, 800, 295; 313/512; 257/85

(56) References Cited

U.S. PATENT DOCUMENTS

| 5,851,063 | A  |   | 12/1998 | Doughty et al. |
| 6,179,449 | B1 | * | 1/2001  | Chen .......................... 362/293 |
| 6,404,131 | B1 | * | 6/2002  | Kawano et al. ............... 315/82 |
| 6,509,651 | B1 | * | 1/2003  | Matsubara et al. .......... 257/461 |
| 6,550,949 | B1 | * | 4/2003  | Bauer et al. ................. 362/545 |
| 2001/0001207 | A1 |  | 5/2001  | Shimizu et al. |

FOREIGN PATENT DOCUMENTS

| JP | 10-209504 | 8/1998 |
| JP | 10-242513 | 9/1998 |
| JP | 11177143 A | 7/1999 |

* cited by examiner

Primary Examiner—John Anthony Ward
Assistant Examiner—Bertrand Zeade
(74) Attorney, Agent, or Firm—Harness, Dickey & Pierce, P.L.C.

(57) ABSTRACT

An illumination light source includes four different types of LEDs, namely a blue light-emitting diode 11 emitting blue light, a blue-green light-emitting diode 12 emitting blue-green light, an orange light-emitting diode 13 emitting orange light and a red light-emitting diode 14 emitting red light. Thus, an illumination light source having high efficiency and high color rendering performance is provided.

15 Claims, 19 Drawing Sheets spectral distribution spectral distribution

ILLUMINATION LIGHT SOURCE

BACKGROUND OF THE INVENTION

The present invention relates to an illumination light source provided with light-emitting diodes.

A light-emitting diode (referred to below as "LED") is a semiconductor device that can produce an emission with a brilliant color and high efficiency in spite of its small size. The emission produced by an LED has a high color purity because of its narrow spectral half-width. Recently, blue LEDs have been put to practical use, so that LEDs are now available in the three colors red, green and blue, which makes it possible to produce white light with the LEDs.

In the prior art, LEDs have been mainly applied to display devices. For that reason, the use of LEDs as a light source for illumination purposes has not yet been researched and developed sufficiently. When LEDs are used for a display device, just the light emitted spontaneously from the LEDs should have its properties optimized. However, where LEDs are used in combination as the light source for illumination purposes, the white light, with which an object will be illuminated, should have its color rendering performance adjusted as well. In the current state of the art, LED illumination light sources with optimized color rendering performance have not yet been developed.

LEDs have excellent monochromaticity. Accordingly, if white light produced by LEDs is to be used as illumination light, this high color purity and the material characteristics that are unique to LEDs may cause various problems regarding, for example, the problem which distribution spectra to include in the LED light sources in order to obtain white light that is suitable for illumination, or the problem which luminescent materials to use for the LEDs, since the emission spectrum and the luminous efficacy may vary depending on the luminescent material of the LED.

SUMMARY OF THE INVENTION

Therefore, with the foregoing in mind, it is a main object of the present invention to provide an LED illumination light source having high efficiency and high color rendering performance.

An illumination light source according to the present invention includes four types of light-emitting diodes, wherein the four types of light-emitting diodes are a blue light-emitting diode emitting blue light, a blue-green light-emitting diode emitting blue-green light, an orange light-emitting diode emitting orange light and a red light-emitting diode emitting red light.

In an embodiment, the blue light-emitting diode has an emission wavelength peak at 420 to 470 nm, the blue-green light-emitting diode has an emission wavelength peak at 500 to 550 nm, the orange light-emitting diode has an emission wavelength peak at 570 to 600 nm, and the red light-emitting diode has an emission wavelength peak at 610 to 660 nm.

In a preferred embodiment, the blue light-emitting diode has an emission wavelength peak at 450 to 470 nm, the blue-green light-emitting diode has an emission wavelength peak at 510 to 540 nm, the orange light-emitting diode has an emission wavelength peak at 580 to 600 nm, and the red light-emitting diode has an emission wavelength peak at 625 to 650 nm.

In another embodiment, the emission wavelength peaks of the four types of light-emitting diodes are different from corresponding hypothetical emission wavelength peaks that are calculated based on results of a theoretical simulation.

It is preferable that the illumination light source has a general color rendering index of at least 90.

It is preferable that when the illumination light source has a correlated color temperature of less than 5000 K and when a color rendering performance of the illumination light source is evaluated using a blackbody source as a standard source, the illumination light source has a spectral distribution in which the luminous intensities of the blue light-emitting diode, the blue-green light-emitting diode, the orange light-emitting diode and the red light-emitting diode increase in this order.

It is preferable that when the illumination light source has a correlated color temperature of at least 5000 K and when the color rendering performance of the illumination light source is evaluated using an artificial daylight source as the standard source, the illumination light source has a spectral distribution, in which the luminous intensity of the blue light-emitting diode is higher than the luminous intensity of the blue-green light-emitting diode, and the luminous intensity of the red light-emitting diode is higher than the luminous intensity of the orange light-emitting diode.

It is preferable that a gamut area obtained by connecting four chromaticity coordinates of special color rendering indices R9 through R12 of respective test colors rendered by the illumination light source is larger than the gamut area obtained by connecting the four chromaticity coordinates of the respective test colors rendered by the standard source.

It is preferable that a ratio (Ga4) of a gamut area obtained by connecting four chromaticity coordinates of special color rendering indices R9 through R12 of the respective test colors rendered by the illumination light source to a gamut area obtained by connecting the four chromaticity coordinates of the respective test colors rendered by the standard source is larger than a ratio (Ga) of a gamut area obtained by connecting eight chromaticity coordinates of color rendering indices R1 through R8 of respective test colors rendered by the illumination light source to a gamut area obtained by connecting the eight chromaticity coordinates of the respective test colors rendered by the standard source.

It is preferable that the illumination light source has a general color rendering index of at least 90.

In an embodiment, the illumination light source further includes a phosphor that emits light when excited by emission of the light-emitting diodes.

It is preferable that the phosphor is a yellow or a green emitting phosphor that is excited by an emission of the blue light-emitting diode and emits light in a range between green and yellow, and the phosphor has an emission distribution in which a spectral half-width of the phosphor is wider than the spectral half-widths of the light-emitting diodes.

In an embodiment, the illumination light source further includes a luminous intensity control means for adjusting a luminous intensity ratio of each of the four types of light-emitting diodes.

It is preferable that an emitting site of the blue light-emitting diode and an emitting site of the orange light-emitting diode are provided within a single chip, and an emitting site of the red light-emitting diode and an emitting site of the blue-green light-emitting diode are provided within a single chip.

In an embodiment, the illumination light source includes a power supply for supplying power to the four types of LEDs. Moreover, it is preferable that a heat-dissipating part for dissipating heat from the LEDs is integrated into the illumination light source. Furthermore, it is preferable that the illumination light source further includes a reflector for reflecting light produced by the light-emitting diodes.

The illumination light source according to the present invention includes four types of light-emitting diodes, namely a blue light-emitting diode emitting blue light, a blue green light-emitting diode emitting blue-green light, an orange light-emitting diode emitting orange light, and a red light-emitting diode emitting red light. Thus, an LED illumination light source having high efficiency and high color rendering performance can be provided, using a minimum number of color LEDs as structural elements.

DETAILED DESCRIPTION OF THE INVENTION

The inventors have studied conventional illumination light sources using LEDs, and the results of this study will be first described preceding the description of preferred embodiments of the present invention.

Conventionally, light sources emitting in three wavelength ranges combining blue, green and red emission spectra are well known as illumination light sources that realize an ideal spectral distribution with high efficiency and high color rendering performance. For example, U.S. Pat. No. 4,176,294 discloses that the three wavelength ranges with the ideal spectral distribution for high efficiency and high color rendering performance can be realized theoretically by setting the wavelength ranges to 430 to 485 nm, 515 to 570 nm and 588 to 630 nm. According to U.S. Pat. No. 4,176,294, this can also be realized by solid-state light sources (such as junction-type emitters and electroluminescence light sources).

Figure 1:
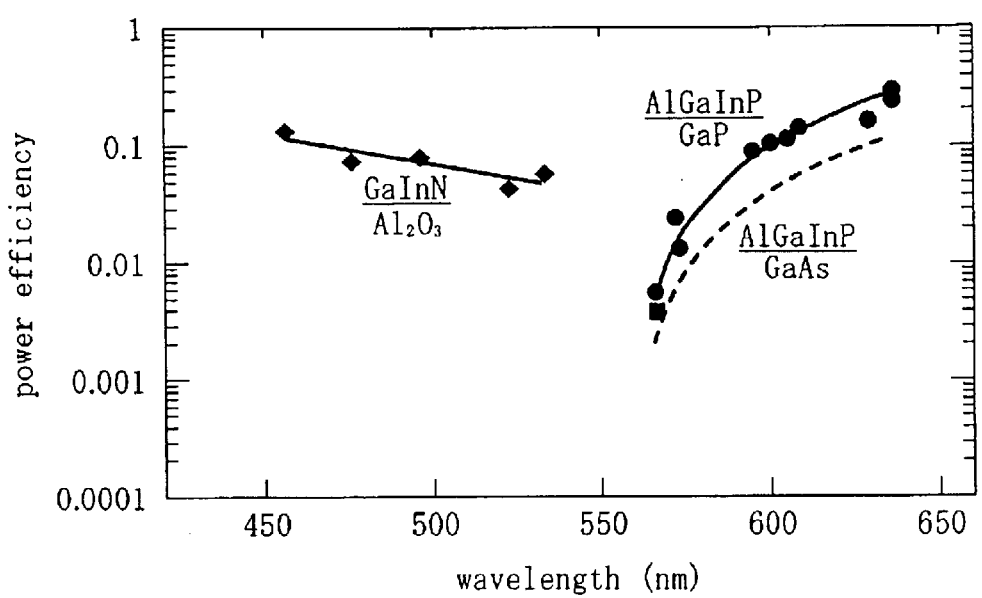
FIG. 1 is a graph schematically illustrating efficiency of LEDs at respective emission peak wavelengths.

However, even though a solid-state light source having high efficiency and high color rendering performance can be theoretically achieved by setting the three wavelength ranges as described above, it is difficult to realize such a light source in actuality. The reason for this is that no practical high-efficiency LED exists that emits a spectrum corresponding to the green emission of the light source emitting the theoretical three wavelength ranges, with which such a light source could be realized. That is to say, as shown in FIG. 1, as highly efficient and practical LEDs, there are only GaN-based LEDs having an emission peak wavelength in the range from ultraviolet to about 530 nm or AlInGaP-based LEDs having an emission peak wavelength in the range from 580 nm to 660 nm. Thus, there is no practical and highly efficient LED covering a wavelength range of about 530 to 575 nm. This means, there is a large gap in the emission spectrum corresponding to the green emission of the light source emitting in the theoretical three wavelength ranges and having high color rendering performance and high efficiency.

Accordingly, a light source having an excellent color rendering performance cannot be obtained by simply using blue, green and red LEDs that have been applied to conventional display devices. The inventors of the present invention examined a general color rendering index (Ra) of a light source made of blue, green and red LEDs for conventional display devices and found that this light source has a very low general color rendering index of about 20 at respective color temperatures from around 3000 K of a light bulb through around 6600 K of daylight. In other words, when blue, green and red LEDs having respective peak wavelengths around 470 nm, 525 nm and 640 nm, which have been used for conventional display purposes, are directly used for illumination, they can only realize a light source having a poor color rendering performance.

The inventors also found that the general color rendering index was as low as around 60 even when using the blue, green and red LEDs having respective peak wavelengths around 470 nm, 525 nm and 615 nm, which are in the respective three wavelength ranges of an ideal spectral distribution that theoretically exhibits high efficiency and high color rendering performance, instead of simply using the conventional blue, green and red LEDs for display. A high-color-rendering light source is required to have a general color rendering index of at least 80, so that it is very difficult to realize a high-color-rendering light source consisting of LEDs based on the conventional theory of the light source emitting in three wavelength ranges.

The inventors examined why the realization of high-color-rendering light sources based on the conventional theory of the light source emitting in three wavelength ranges is difficult, and found the following. Conventionally, simulations for designing high-color-rendering light sources were performed on the assumption that the emission spectra of the light source will follow either a Gaussian or an asymmetric Gaussian distribution. However, setting the emission spectra like this leads to a discrepancy between the actual spectral distribution and the theoretical one. For this reason, it is difficult to realize a high-color-rendering light source with LEDs.

For example, Japanese Laid-Open Publication No. 10-209504 discloses that if the emission spectra of the light source are calculated assuming that they follow the Gaussian distribution, and using the LEDs for illumination purposes, if the three wavelength ranges increasing the color rendering performance are 455 to 490 nm, 530 to 570 nm and 605 to 630 nm, and the LEDs emit in these ranges, then the general color rendering index becomes at least 80. This publication discusses only a simulation, and thus, assumes a green emission range of about 530 to 575 nm, a range for which high-efficiency LEDs do not exist. Even setting aside this assumption, however, considering the fact that the general color rendering index is as low as around 60 when using the spectral distribution of real LEDs, it can be seen that there is a significant gap between the theory of the Gaussian spectral distribution that has been conventionally used for theoretical simulations and the reality.

The inventors studied the cause of this discrepancy from a theoretical point of view, assuming that the emission is produced by the LEDs, and found that for an emission spectrum having a narrow spectral half-width like that of an LED, if a Gaussian distribution is adopted, then a significant discrepancy occurs between the assumed spectral distribution and the real spectral distribution. The inventors also found that this discrepancy increases as the spectral half-width, i.e., full width at half maximum, becomes narrower and the color purity becomes higher.

This discrepancy between theory and reality could not be sufficiently corrected even by using an asymmetric Gaussian distribution assuming Stokes shift or the like (in which the emission spectra in longer and shorter wavelength ranges than the spectral distribution peak are deformed in view of the Stokes shift or the like). That is to say, even with the asymmetric Gaussian distribution, if the spectral distribution has a narrow spectral half-width like that of an LED, then a gap still occurs between the theoretical spectral distribution and the real spectral distribution.

In addition, taking characteristics of the actual materials and element structures into account, the gap between theory and reality increases even further. This is because of the material-specific deformations of the spectral distribution of real LEDs. The theory also cannot sufficiently correct such discrepancies as the significant discrepancy for LEDs having emission peaks near both the short and the long wavelength ends of the visible spectrum range, and the discrepancy due to the shape of the spreading region at the bottom of the spectral distribution.

Figure 2A:
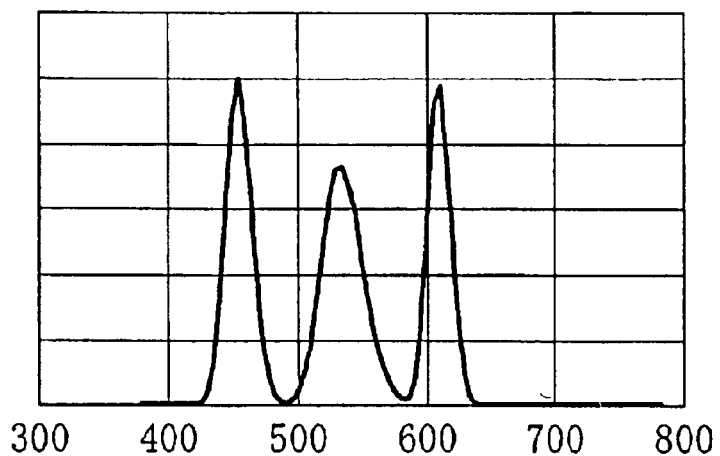
FIG. 2A is a graph illustrating a spectral distribution as a result of simulation using an asymmetric Gaussian spectral distribution.
Figure 2B:
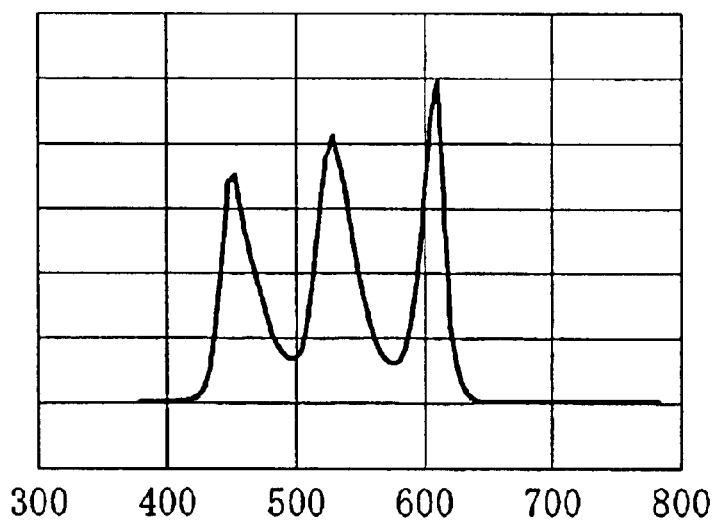
FIG. 2B is a graph illustrating a spectral distribution based on an actual measurement.

Hereinafter, the gap between theory and reality will be further described with reference to FIGS. 2A and 2B. FIGS. 2A and 2B illustrate a spectral distribution of an LED light source made of three types of LEDs with emission peak wavelengths at 450 nm, 530 nm and 610 nm.

FIG. 2A shows the spectral distribution simulated with an asymmetric Gaussian spectral distribution. In the example illustrated in FIG. 2A, the correlated color temperature is 6500 [K] and Duv is 0. The luminous flux ratios of the LEDs having respective peak wavelengths of 450 nm, 530 nm and 610 nm are determined uniquely by the simulation to be 0.3277, 0.3820 and 0.2903, respectively. The general color rendering index Ra is 82.8.

On the other hand, FIG. 2B is a graph illustrating a spectral distribution based on actual measurement. That is to say, based on the simulation results shown in FIG. 2A, the spectral distribution in FIG. 2B is obtained by combining LEDs with the same emission peak wavelengths and the same half-widths in an actual measurement. In the example illustrated in FIG. 2B, the luminous fluxes of the LEDs having respective wavelengths of 450 nm, 530 nm and 610 nm are taken analogously to FIG. 2A, to be 0.3277, 0.3820 and 0.2903, respectively. In this case, the correlated color temperature was 5890 [K], Duv was 15 and the general color rendering index Ra was 88.6.

FIGS. 2A and 2B are only an example, but it can be seen how significantly the conventional theoretical simulation differs from the actual measurement, when determining the spectral distributions of LEDs for illumination purposes. Such a number of differences between theory and reality exist in the prior art, but they were not easy to estimate and have not been pointed out conventionally. Based on the limits of conventional theoretical estimations, the inventors examined the simulation and the actual measurement in combination, and consequently found that if the peak wavelength of each luminescent material is shifted to the long wavelength side, then the corresponding spectral half-width increases. Moreover, the inventors also found that, it is effective to correct the deformation of the spectral distribution that is peculiar to each luminescent material based on an actual measurement when optimizing the spectral distribution that is unique to the LED.

Japanese Laid-Open Publication No. 11-177143 discloses another known example. Based on an actual measurement of the spectral distribution, this publication suggests that the general color rendering index decreases when the spectral distribution of an emission in the three wavelength ranges of blue, green and red is taken as the primary emission wavelengths. This publication also discloses an LED light source emitting in six wavelength ranges with a general color rendering index Ra of 88 or more, which is realized by adding this actual measurement to the emission in the three wavelength ranges of blue, green and red.

However, light sources emitting in six wavelength ranges (light sources using six different types of LEDs) pose the following problems. Since the emission characteristics and lifetime of the LEDs with the different emission wavelengths vary depending on ambient temperature, control of the LEDs for producing a constant white light under a variety of conditions becomes much more difficult as the number of colors to be mixed increases. That is to say, an LED has different temperature characteristics and lifetime properties at each wavelength, due material factors. Accordingly, as the number of LEDs to be combined increases in order to form a light source having a large number of peak wavelengths, it becomes much more difficult to combine the LEDs so as to produce light of one color (e.g. white). Therefore, in view of practicability, it is desirable to realize an adequate color rendering performance with LEDs of a minimum number of necessary colors. It should be noted that, in the Japanese Laid-Open Publication No. 11-177143, the discussion is given based on the actual measurement value itself, but without regard to the relationship between the spectral distribution of the emitted light and the corresponding level of the luminous efficacy. Therefore, the requirements for achieving high efficiency as well as high color rendering performance are not discussed therein at all.

The foregoing examinations of known LED illumination light sources, which the inventors performed, can be summarized as follows:

1. When attempting to realize a known light source emitting in three wavelength ranges with LEDs, it is difficult to realize a high-efficiency and high-color-rendering LED illumination light source based on light sources emitting in three wavelength ranges, because there is no high-efficiency, practical LED emitting in the wavelength range corresponding to the green emission wavelength.

2. When the conventional theory is applied to LEDs having a narrow half-width and a high color purity, slight discrepancies may lead to a large discrepancy between theory and reality.

3. When LEDs emitting a plurality of colors are combined to produce white light, it becomes easier to achieve a high color rendering performance, but it also becomes more difficult to control the color of the illumination light to be constant, because of the variation of temperature and lifetime characteristics of the LEDs at each emission color. Therefore, in view of practicability, there is a demand for a high-efficiency and high-color-rendering LED illumination light source combining a minimum number of different LEDs.

Figure 3:
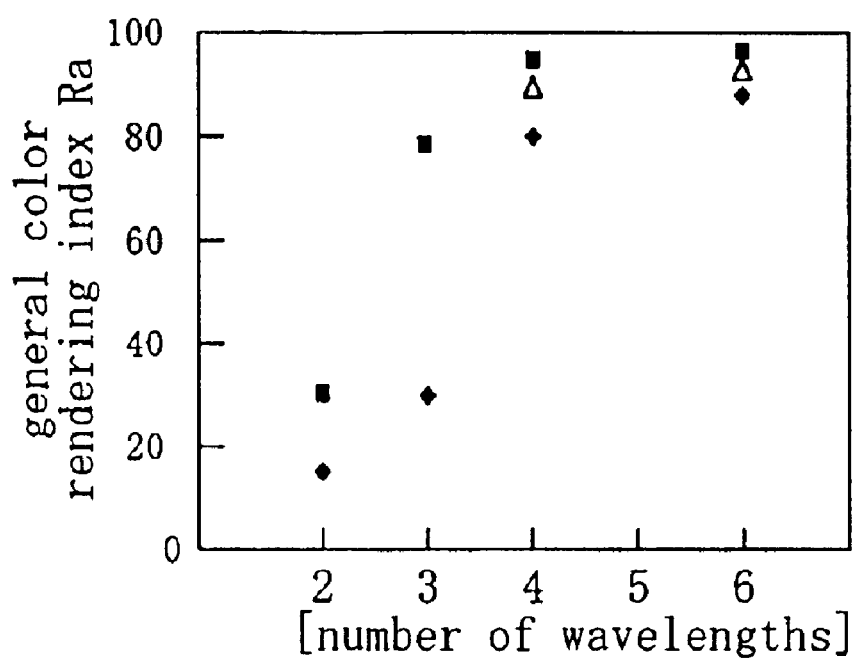
FIG. 3 is a graph illustrating relations between the number of LED peak wavelengths and a general color rendering index Ra.

FIG. 3 illustrates the relation between the number of LED peak wavelengths and the general color rendering index. The results shown in FIG. 3 are based on experiments by the inventors and values disclosed in the afore-mentioned publications.

FIG. 3 shows that the general color rendering index is improved as the number of LED peak wavelengths increases. In addition, FIG. 3 also shows that a light source exhibiting a sufficiently good color rendering performance can be realized with a light source emitting in four wavelength ranges instead of a light source emitting in six wavelength ranges. In other words, a light source having a high general color rendering index that could not be surpassed by an LED light source emitting in three wavelength ranges, which uses actually existing high-efficiency LEDs, can be realized with a light source emitting in four wavelength ranges. More specifically, a light source that belongs to color rendering performance group 1A (Ra≧90) according to the CIE (Commission Internationale de l'Eclairage) classification and that is well applicable to applications requiring accurate color rendering can be realized with a light source emitting in four wavelength ranges. Therefore, there is no need to use the light source emitting in six wavelength ranges requiring multiple types of the LEDs, which has been conventionally believed to be necessary. As can be seen from the results shown in FIG. 3, when current LEDs are used for a high-efficiency and high-color-rendering (i.e., Ra is 90 or more) light source, the LEDs should have a minimum of four peak wavelengths and emit in a minimum of four wavelength ranges.

Hereinafter, preferred embodiments of the present invention will be described with reference to the accompanying drawings. In the drawings, structural elements with substantially the same function will be identified by the same reference numeral for the sake of simplicity of description. It should be noted that the present invention is not limited to the following embodiments.

Embodiment 1

Figure 4:
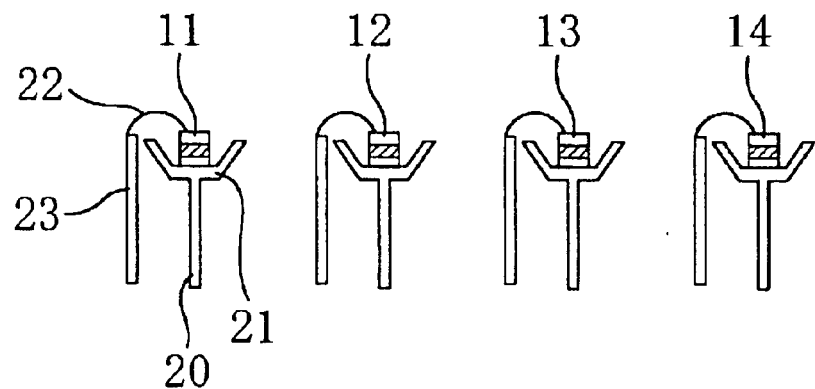
FIG. 4 schematically illustrates the structure of an LED illumination light source according to Embodiment 1.
Figure 5:
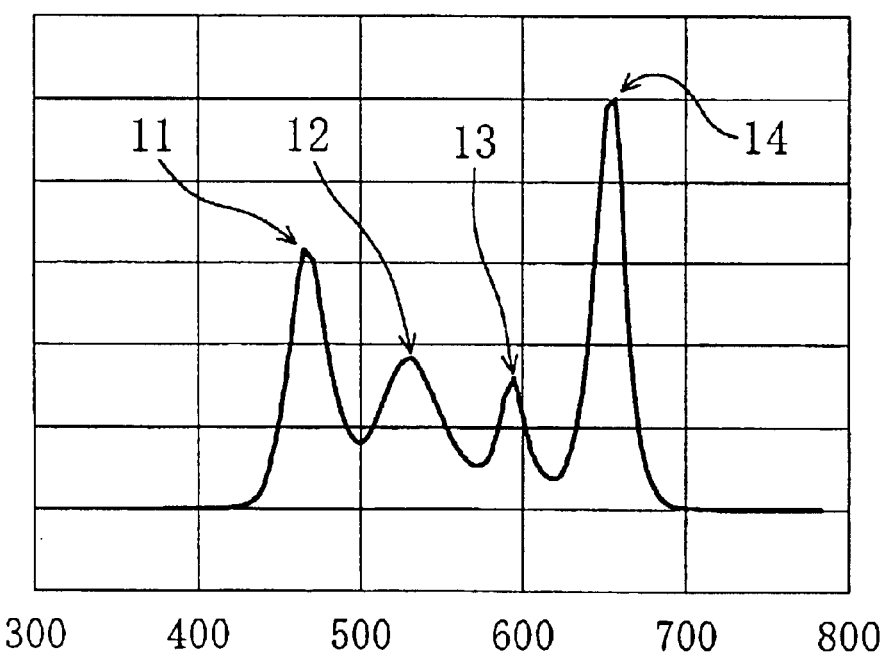
FIG. 5 is a graph schematically illustrating a spectral distribution of the LED illumination light source according to Embodiment 1.

An illumination light source according to Embodiment 1 of the present invention will be described with reference to FIGS. 4 to 6B. FIG. 4 schematically illustrates the structure of an LED illumination light source according to Embodiment 1, and FIG. 5 schematically illustrates the spectral distribution of the illumination light source.

The illumination light source shown in FIG. 4 includes four types of LEDs (11, 12, 13 and 14). More specifically, the illumination light source of this embodiment includes a blue LED 11 emitting blue light, a blue-green LED 12 emitting blue-green light, an orange LED 13 emitting orange light and a red LED 14 emitting red light.

The blue LED 11 and the blue-green LED 12 are made of, for example, GaN-based compounds (which includes not only GaN, but also InGaN, AlGaN and AlInGaN, i.e., given by the general formula $In_iGa_jAl_kN$, where $0 \leq i$, $0 < j$, $0 \leq k$ and $i+j+k=1$). The orange LED 13 and the red LED 14 are made of AlInGaP—, GaAsP— or GaAlAs-based compounds, for example. Commercial products can be used as these LEDs.

Moreover, the blue LED 11 and the blue-green LED 12 may be not only GaN-based LEDs but also ZnO—or ZnSe-based LEDs. ZnO-based LEDs are light-emitting diodes having a p-n junction formed by a p-type semiconductor made of copper oxide and several other metallic oxides, and an n-type semiconductor made of zinc oxide. In case of the ZnO-based LEDs, the wavelength can be set to any value from about 380 nm to about 500 nm by changing the compounds to be mixed. Furthermore, it is also possible to use a light-emitting element that converts the emission of a red laser diode into a blue emission with an element made of an nonlinear optical crystal as the blue LED 11 and the blue-green LED 12. In other words, the blue LED 11 and the blue-green LED 12 may be fabricated of an element made of a nonlinear optical crystal and a light-emitting element including a red laser diode. This element including a non-linear optical crystal can be made of lithium niobium or the like, is referred to as an SHG (second harmonic generation) element and can convert the wavelength of a red laser into, for example, half its wavelength.

In the present embodiment, each of the LEDs (11 through 14) is placed on a plate-like (or cup-like) pedestal 21, which is an integral part of a leadframe 20. The lower end (i.e., lower terminals) of each of the LEDs is in contact with the pedestal 21, whereas the upper end (i.e., upper terminals) of each of the LEDs is electrically connected to a lead 23 via a bonding wire 22.

In the present embodiment, the anodes and cathodes of the LEDs are disposed on the upper and lower surfaces of the LEDs (11 through 14). Alternatively, the anode and the cathode can also be provided on the same side of the LED. The structure of the leadframes 20 in the illustrated embodiment is merely an example, and it is also possible to place at least two types of LEDs on one pedestal 21, and to connect the leadframes 20 electrically to one another. Also, in the illustrated embodiment, the LEDs (11 through 14) are electrically connected to the leadframes 20 by wire bonding. However, there is no limitation to this, and the LEDs may also be flip-chip mounted. In that case, the bonding wires 22 can be omitted. The leadframes 20 are electrically connected to an external circuit (e.g., lighting circuit) not shown in FIG. 4. When power is supplied to the LED illumination light source through the leadframes 20 to activate the LEDs (11 through 14), an illumination light having a spectral distribution as shown in FIG. 5 can be attained.

As shown in FIG. 5, the spectral distribution of the illumination light source according to this embodiment includes the emission peaks of the blue LED 11, then blue-green LED 12, the orange LED 13 and the red LED 14. The blue LED 11 has its emission peak at 420 to 470 nm, the blue-green LED 12 has its emission peak at 500 to 550 nm, the orange LED 13 has its emission peak at 570 to 600 nm, and the red LED 14 has its emission peak at 610 to 660 nm. An LED illumination light source having high efficiency and high color rendering performance (i.e., with a general color rendering index of 80 or more, or even 90 or more) can be realized by combining these four different types of LEDs 11 through 14. It is even more preferable that the blue LED 11 has its emission peak at 450 to 470 nm, the blue-green LED 12 has its emission peak at 510 to 540 nm, the orange LED 13 has its emission peak at 580 to 600 nm, and the red LED 14 has its emission peak at 625 to 650 nm.

As can be seen from the relation between the type of LEDs and the efficacy at each emission peak wavelength shown in FIG. 1, LEDs made of the GaN-based luminescent material have a higher luminous efficacy at shorter wavelengths, whereas LEDs made of the AlInGaP-based luminescent materials have a higher luminous efficacy at longer wavelengths. However, high-efficiency LEDs covering a (green) emission range of about 530 to 575 nm have not been realized. Therefore, the structure according to this embodiment has great significance with regard to the realization of an actual LED illumination light source having high efficiency and high color rendering performance.

Moreover, the structure of this embodiment also has great significance with respect to the production or manufacturing process of manufacturing LEDs made of GaN-based lumi nescent materials. That is to say, if an illumination light source having a very high general color rendering index Ra of 90 or more can be realized by using LEDs having emission peak wavelengths of 530 nm or less, then there is no need to use LEDs having an emission peak wavelength of more than 530 nm, which are poor in productivity. Accordingly, there are large advantages regarding the production or manufacturing process.

When merely a high color rendering performance is desired, it is sufficient to increase the number of emission colors to be combined. However, this makes the control more complicated, so that it also has great significance to constitute the illumination light source with four types of LEDs, which is the minimum combination of emission colors, in order to improve the color rendering as described in this embodiment. The emission peaks of the LEDs 11 through 14 in this embodiment are different from the corresponding hypothetical peaks that are simply calculated from the results of a simulation according to a theoretical model (e.g., a model assuming that the emission spectrum follows a Gaussian distribution or a model assuming that the emission spectrum follows an asymmetric Gaussian distribution). Preferred combinations of the emission peaks of the LEDs 11 through 14 will be described later.

Figure 6A:
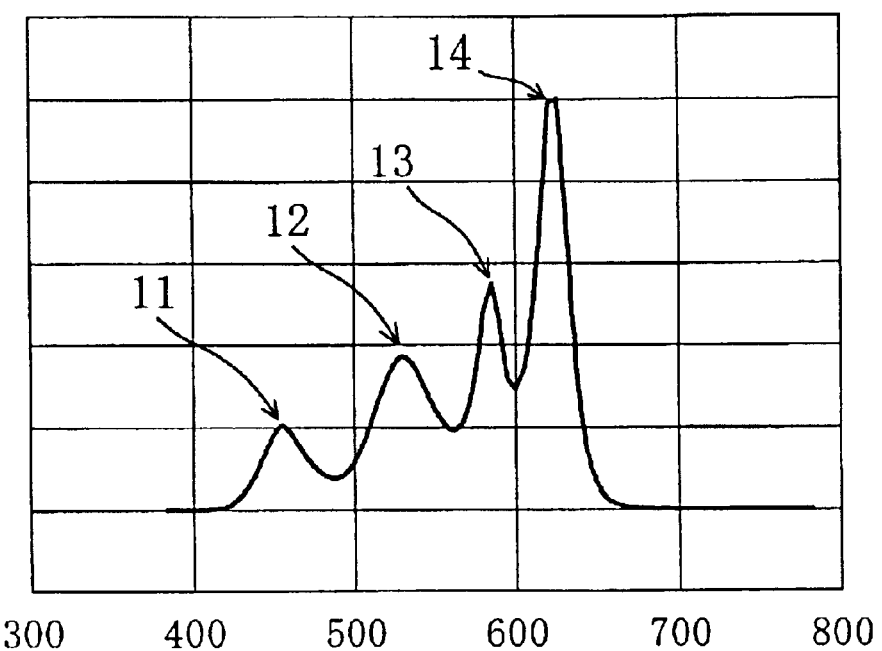
FIG. 6A is a graph illustrating a spectral distribution when the correlated color temperature is relatively low.
Figure 6B:
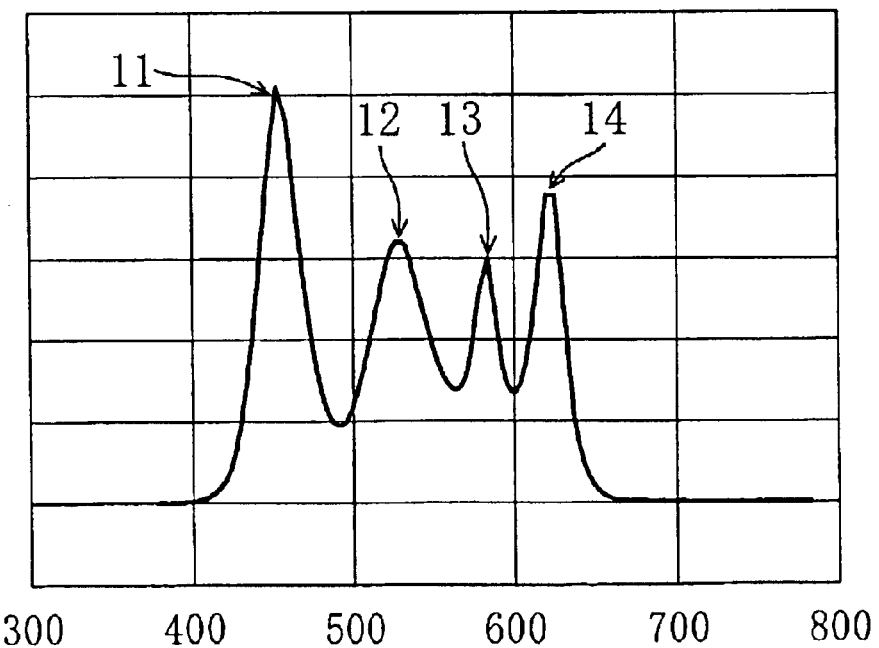
FIG. 6B is a graph illustrating the spectral distribution when the correlated color temperature is relatively high.

FIGS. 6A and 6B illustrate preferred examples of spectral distributions of an illumination light source according to this embodiment. FIG. 6A shows an example in which the correlated color temperature is relatively low (at 2800 K), whereas FIG. 6B shows an example in which the correlated color temperature is relatively high (at 6500 K). In the spectral distributions illustrated in FIGS. 6A and 6B, the respective emission peaks of the blue LED 11, the blue-green LED 12, the orange LED 13 and the red LED 14 are 455 nm, 530 nm, 585 nm and 625 nm.

The general color rendering index Ra of the example shown in FIG. 6A is 93, and the general color rendering index Ra of the example shown in FIG. 6B is 95. In both cases, they belong to the color rendering performance group 1A (Ra$\geq$90) according to the CIE (Commission Internationale de l'Eclairage) classification. That is to say, these light sources are well applicable to various applications (e.g., in museums) that require a stringent color rendering performance, and by simply adjusting the emission ratio (luminous flux ratio) of the same four types of LEDs (11 through 14), both of these light sources can achieve an illumination light source exhibiting excellent color rendering performance of an Ra of at least 90, at a relatively low correlated color temperature and at a relatively high correlated color temperature.

For the purpose of finding various combinations of LEDs (11 through 14) that exhibit excellent color rendering performance as shown in FIGS. 6A and 6B, the inventors combined four different types of LEDs (11 through 14) emitting blue, blue-green, orange and red in a matrix with peak wavelengths shifted by 5 nm, and calculated the respective color rendering performance. As a result, Table 1 shows the combinations that have excellent color rendering performance while having similar emission peaks at all correlated color temperatures for correlated color temperatures of about 3000 K to 6500 K.

TABLE 1

| Peak wavelength [nm] | | | | Luminous flux ratio | | | | | | |
|---|---|---|---|---|---|---|---|---|---|---|
| Blue | Blue-green | Orange | Red | Blue | Blue-green | Orange | Red | Ra | Ga | Ga4 |
| 3000 K | | | | | | | | | | |
| 450 | 520 | 580 | 630 | 1.13 | 35.41 | 39.93 | 23.52 | 94.4 | 103.9 | 106.3 |
| 455 | 525 | 580 | 625 | 1.53 | 37.64 | 34.83 | 26.00 | 94.4 | 102.6 | 106.4 |
| | | | 630 | 1.53 | 36.99 | 37.71 | 23.78 | 96.4 | 104.6 | 111.5 |
| 460 | 530 | 580 | 620 | 2.08 | 40.39 | 28.06 | 29.47 | 92.8 | 100.1 | 103.7 |
| | | | 625 | 2.08 | 41.43 | 28.79 | 27.70 | 94.8 | 105.4 | 112.1 |
| 5000 K | | | | | | | | | | |
| 450 | 520 | 580 | 630 | 2.64 | 44.73 | 36.80 | 15.83 | 93.9 | 104.3 | 108.0 |
| 455 | 525 | 580 | 625 | 3.54 | 47.25 | 30.86 | 18.34 | 95.8 | 104.2 | 108.7 |
| | | | 630 | 3.55 | 45.99 | 34.22 | 16.24 | 95.1 | 103.7 | 111.5 |
| 460 | 530 | 580 | 620 | 4.76 | 49.17 | 25.01 | 21.06 | 94.2 | 100.9 | 104.8 |
| | | | 625 | 4.77 | 48.36 | 28.12 | 18.75 | 96.1 | 102.0 | 109.7 |
| 6700 K | | | | | | | | | | |
| 450 | 520 | 580 | 630 | 3.65 | 48.02 | 34.77 | 13.56 | 93.9 | 104.7 | 110.0 |
| 455 | 525 | 580 | 625 | 4.80 | 50.02 | 29.46 | 15.72 | 95.7 | 103.6 | 109.6 |
| | | | 630 | 4.80 | 48.89 | 32.41 | 13.89 | 94.8 | 102.9 | 112.2 |
| 460 | 530 | 580 | 620 | 6.42 | 51.77 | 23.26 | 18.55 | 93.3 | 101.1 | 106.3 |
| | | | 625 | 6.43 | 50.73 | 26.53 | 16.31 | 94.2 | 101.3 | 110.4 |

"Ga" and "Ga4" in Table 1 will be detailed later in Embodiment 2. To explain them briefly, "Ga" is a gamut area ratio obtained on the basis of eight test colors R1 through R8 for calculating the general color rendering index, whereas "Ga4" is a gamut area ratio obtained on the basis of four test colors R9 through R12 for calculating a special color rendering index.

As can be seen from Table 1, when LEDs (11 through 14) having respective peak emission wavelengths at about 455 nm, 525 nm, 580 nm and 625 nm are combined, a high-color-rendering illumination light source having an Ra near 95 at all practical correlated color temperatures can be realized with the combination of these LEDs, simply by changing the emission ratio (luminous flux ratio) of these LEDs. In view of manufacturing variations of the emission peaks of the actually produced LEDs, the optimum peak emission wavelength of each of the LEDs to be combined together is within the range of the aforementioned values plus or minus 10 nm. In other words, a high-color-rendering illumination light source can be provided by combining LEDs having peak emission wavelengths of 455 nm, 525 nm, 580 nm and 625 nm or having respective peak emission wavelengths that are slightly shifted (e.g., about ±5 to 10 nm) from these.

The general color rendering index Ra of an ordinary light bulb is 100, whereas the Ra of the illumination light source according to this embodiment is close to 95. Accordingly, ordinary light bulbs can be replaced by the illumination light sources of this embodiment with regard to their color rendering performance. Moreover, the illumination light source in this embodiment is made of LEDs (11 through 14) having a high luminous efficacy, so that an illumination light source can be provided, whose luminous efficacy is better than that of ordinary light bulbs.

In addition, the fact that light sources can be realized that have an Ra of 90 or more at correlated color temperature ranges that are applicable for illumination purpose, and that these light sources can be realized simply by adjusting the luminous intensities of LEDs having the same emission peaks means that under the premise of industrial production, LEDs having those specific emission peaks may be mass-produced. Therefore, the illumination light source according to this embodiment has a structure that is highly effective in achieving the economies of mass production as well as advantageous in cost reduction.

If the LED illumination light sources at various correlated color temperatures are made of the LEDs 11 through 14 so as to achieve a high color rendering performance of an Ra of at least 90, the emission peaks of the LEDs to be combined are not limited to 455 nm, 525 nm, 580 nm and 625 nm, but can be in the ranges of 450 to 470 nm, 510 to 540 nm, 580 to 600 nm and 625 to 650 nm, in view of variations that appear in the production process or color shifts during lighting operations.

Embodiment 2

Embodiment 2 relates to the optimization of the combinations of the blue LED 11, the blue-green LED 12, the orange LED 13 and the red LED 14. In Embodiment 1, the illumination light source includes four different types of LEDs (11 through 14), so that it can achieve a better color reproducibility than conventional illumination light sources using three different types of LEDs, as described above. However, when evaluating the color reproducibility of illumination light sources made of LEDs, the evaluation method for the color reproducibility is problematic. The following is an explanation of this problem.

Compared to the emission of fluorescent lamps, light bulbs and high intensity discharge (HID) lamps, which are used conventionally as illumination light sources, the emission of LEDs has a tendency of rendering an illuminated object in very brilliant colors. But this excellent color rendering performance of the LED lamp cannot be evaluated properly with the conventional general or special color rendering indices only. In other words, the brilliance of the light emitted by LEDs is unique to LEDs used for illumination, and is due to LEDs having a spectral distribution with a narrow half-width and high color purity and without any sub-emission wavelengths.

As shown in FIG. 5, the illumination light source of Embodiment 1 emits light, in which the half width of the LEDs (11 through 14) is narrow. For that reason, compared to other light sources such as fluorescent lamps, LED illumination light sources can render colors much more brilliant. The inventors succeeded in finding preferable spectral distributions for LED illumination light sources as a result of intensive experimentation and research. Hereinafter, a method for optimizing the color reproducibility of the LED illumination light source that was adopted by the inventors will be described first, and then examples of optimum spectral distributions, in which the LED illumination light source can show excellent color reproducibility, will be explained.

First, the problem with the evaluation method using conventional color rendering indices is described. In conventional color rendering indices, each color reproduced on a color chip for color rendering evaluation by a standard source (e.g., artificial daylight or blackbody source) with a correlated color temperature equivalent to that of the light source under test is taken to be 100. Conventional color rendering indices evaluate and represent as an index how much an associated color reproduced on a color chip by the light source under test is different from the color reproduced on the color chip by the standard source. Accordingly, when the color rendered by the light source under test matches the color rendered by the standard source, the light source under test has the highest score. Thus, if the colors rendered by the light source under test look paler and less impressing than those rendered by the standard source, then the score of the light source under test will naturally be low. However, even if the colors rendered by the light source under test look much more brilliant than those rendered by the standard source, the score of the light source under test will also be low, even though the result is preferable. That is to say, there is the problem that the evaluated color rendering is low, even if the colors are more brilliant and contrastive.

Generally speaking, we are always surrounded in our daily life with industrial products in artificially created, glowing colors (e.g., brilliant blue or yellow), not just natural objects with an intermediate saturation like wood and stone. Accordingly, if the colors reproduced on the color chip by the light source under test look more brilliant than those reproduced by the standard source, it is not necessarily proper to give a low score to the light source under test. Thus, to make better use of the characteristics of the LED illumination light source, the inventors optimized the spectral distribution of the LED illumination light source. Hereinafter, the method of optimization adopted by the inventors will be described.

Various international standards already exist for the methods of evaluating the color rendering performance of a light source as disclosed in JIS Z8726 in Japan, for example. Although not included in any of these international standards, performance evaluation using a gamut ratio is one of the generally admitted and authorized methods of evaluating the color rendering performance besides using color rendering indices. According to this method, the color rendering performance of a test source is evaluated by the ratio of the gamut area made up of test colors (R1 to R8) for calculating the general color rendering index. More specifically, the "gamut area" is obtained by plotting and connecting the chromaticity coordinates of the color rendering indices R1 through R8 of eight test colors for use to calculate a general color rendering index Ra. In this method, the gamut areas of test and standard sources are each obtained by connecting the eight chromaticity coordinates thereof together. Then, the ratio of the gamut area of the test source to that of the standard source is taken as the gamut ratio Ga.

According to this color evaluation method, if Ga is less than 100, then the colors rendered by the test source should look paler because the colors have decreased degrees of saturation. On the other hand, if Ga is greater than 100, then the colors rendered by the test source should look more brilliant because the colors have increased degrees of saturation. Thus, if the color rendering performance of a given light source is evaluated not by the difference in color reproduced between the given and standard sources but by the gamut area ratio, then a high score can be given properly to a test source that can reproduce colors of an object brilliantly enough even if its Ra is low. Thus, this method seems to be effectively applicable to properly evaluating the brilliant colors that are characteristic for an LED light source. However, if this performance evaluation method is used alone, a higher Ga ratio may give a higher score to a light source under test. Nevertheless, when the performance of another light source, reproducing similar but excessively brilliant colors, is evaluated by the conventional color rendering indexing, the resultant Ra index will be low. Then, that big difference in colors reproduced between the test and standard sources will make an impression of unnatural illumination on the viewer. That is to say, if the Ga ratio alone were used, then the score given as the Ga ratio to the test source might be much different from the score given as the Ra index to the light source.

Thus, the inventors newly used another gamut ratio, obtained by connecting the chromaticity coordinates of four special color rendering indices R9 through R12 for brilliant red, yellow, green and blue, respectively, as an alternative index representing the color rendering performance. That is to say, just like the known Ga ratio obtained by connecting the eight chromaticity coordinates for the color rendering indices R1 through R8 as disclosed in JIS Z8726, another gamut ratio is similarly calculated by using R9 through R12 instead of R1 through R8. This alternative gamut ratio will be herein identified by "Ga4".

The color rendering indices R1 through R8 are essentially selected to evaluate the degree of subtle difference between naturally reproduced colors and are associated with eight test colors with intermediate degrees of saturation. By contrast, the special color rendering indices R9 through R12 are essentially selected to evaluate the degree of difference between brilliantly reproduced colors. Accordingly, by using this new Ga4 ratio, it is possible to evaluate the color rendering performance of a given light source properly by seeing if an object to be seen in brilliant colors does look glowing. That is to say, if an object illuminated should be seen in subtly different and naturally reproduced colors at intermediate degrees of saturation, then the light source should illuminate the object exactly in its natural colors so that the Ga ratio and Ra index can approach 100. On the other hand, if another object should look brilliantly to the human eye, then the light source should illuminate the object in such a manner that the Ga4 ratio increases. Then, the colors reproduced can be optimized. And by optimizing the colors reproduced this way, any object can be illuminated either in naturally reproduced colors or in sharply contrasted colors at high degrees of saturation.

So the inventors carried out the optimization processing on the LED illumination light source of aforementioned Embodiment 1. As a result, the inventors made the following findings:

1. When the respective emission peaks of the LEDs 11 through 14 are 420 to 470 nm, 500 to 550 nm, 570 to 600 nm and 610 to 660 nm, the general color rendering index Ra can be increased, and when the respective emission peaks of the LEDs 11 through 14 are 450 to 470 nm, 510 to 540 nm, 580 to 600 nm and 625 to 650 nm, the Ra can be increased even further.

Figure 7A:
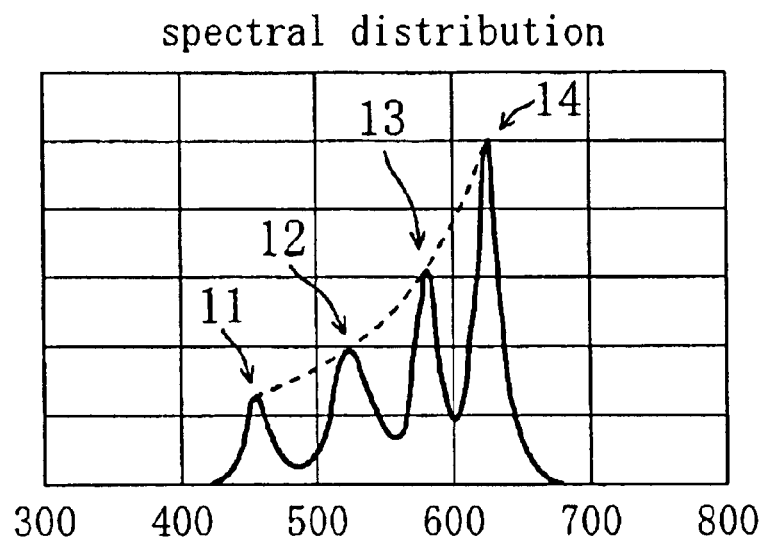
FIG. 7A is a model illustrating a preferable spectral distribution when the correlated color temperature is relatively low.
Figure 7B:
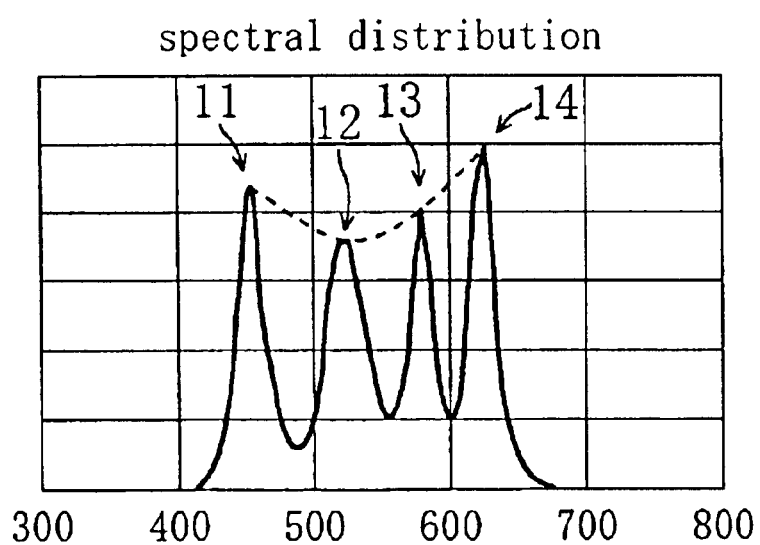
FIG. 7B is a model illustrating the preferable spectral distribution when the correlated color temperature is relatively high.

2. When the correlated color temperature is relatively low (less than 5000 K) and the color rendering performance thereof is evaluated using a blackbody source as a standard source, if an emission distribution can be realized, in which, compared on the spectral distribution, the peak intensity of the LEDs increases in order from the shortest peak wavelength, that is, in the order of LED 11, 12, 13 and 14, then Ra and Ga4 can be both increased and Ga4 can be made higher than Ga. That is to say, in this range, colors with intermediate degrees of saturation, which should be reproduced subtly and precisely, can be reproduced naturally, while colors with high degrees of saturation can be reproduced brilliantly. In order to increase Ra, the peak wavelengths of the LEDs 11 through 14 are preferably set to 450 to 470 nm, 510 to 540 nm, 580 to 600 nm and 625 to 650 nm, respectively 3. When the correlated color temperature is relatively high (5000 K or more) and the color rendering performance is evaluated using an artificial daylight source as a standard source, and with an emission distribution, in which the blue LED 11 (which has the shortest peak wavelength) has a higher peak intensity than the blue-green LED 12 and the red LED 14 (which has the longest peak wavelength) has a higher peak intensity than the orange LED 13, as shown in FIG. 7B, then Ra and Ga4 can be both increased and Ga4 can be made higher than Ga. That is to say, in this range, colors with intermediate degrees of saturation, which should be reproduced subtly and precisely, can be reproduced naturally, while colors with high degrees of saturation can be reproduced brilliantly. As in the case of the item 2, also in this case, the peak wavelengths of the LEDs 11 through 14 are also preferably set to 450 to 470 nm, 510 to 540 nm, 580 to 600 nm and 625 to 650 nm, respectively, in order to increase Ra.

Hereinafter, examples of LED illumination light sources with optimized color reproducibility will be described with reference to FIGS. 8A through 10C and Tables 2 through 4.

Figure 8A:
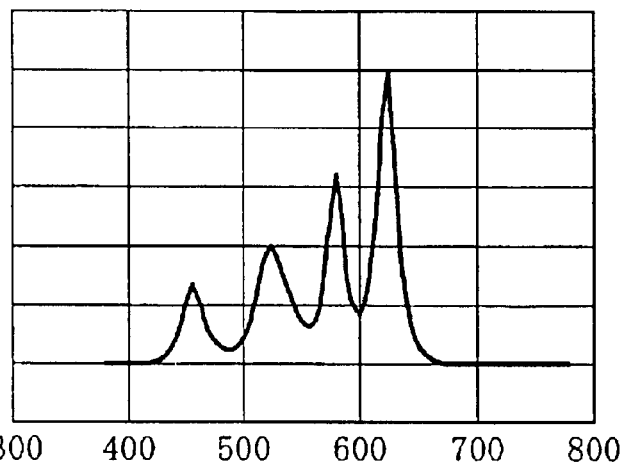
FIG. 8A is a graph illustrating a spectral distribution of the LED illumination light source with optimized color reproducibility when the light source has a correlated color temperature of 3000 K.

FIG. 8A illustrates a spectral distribution of an LED illumination light source with optimized color reproducibility in which the correlated color temperature is as low as 3000 K, which is close to the lower limit of correlated color temperatures for an everyday illumination light source. At this correlated color temperature of 3000 K, a blackbody source is used as the standard source for calculating Ra. In this example, the emission peak wavelengths of the LEDs 11, 12, 13 and 14 are 455 nm, 525 nm, 580 nm and 625 nm, respectively, and their luminous flux ratios are 1.53, 37.64, 34.83 and 26.00, respectively.

Figure 8B:
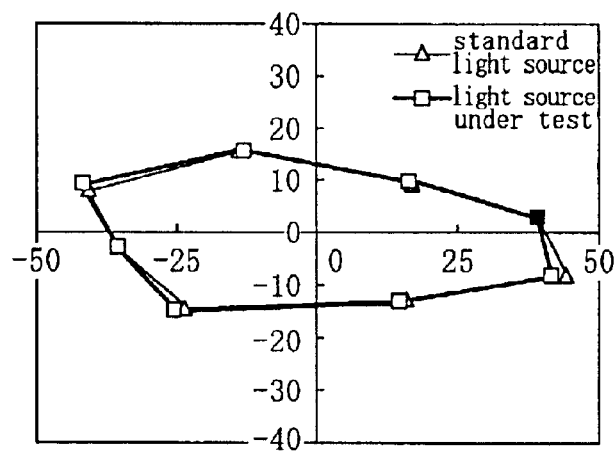
FIGS. 8B and 8C are graphs illustrating its gamut ratios Ga and Ga4, respectively.
Figure 8C:
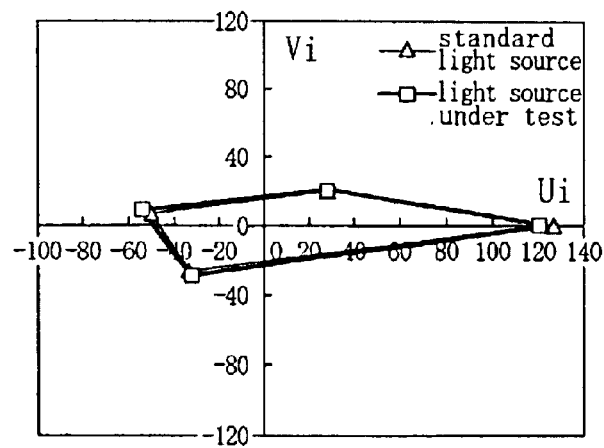

FIG. 8B is a graph showing the gamut ratio due to Ga and FIG. 8C is a graph showing the gamut ratio due to Ga4 for an LED illumination light source having the spectral distribution shown in FIG. 8A. The following Table 2 shows not only these parameters but also the chromaticity coordinates (x, y), Duv, color rendering indices (Ra and R1 through R15) and gamut ratios of the LED illumination light source illustrated in FIGS. 8A, 8B and 8C:

TABLE 2

| LED type | Peak wavelength | Luminous flux ratio |
| --- | --- | --- |
| Blue LED 11 | 455 nm | 1.53 |
| Blue-green LED 12 | 525 nm | 37.64 |
| Orange LED 13 | 580 nm | 34.83 |
| Red LED 14 | 625 nm | 26.00 |

TABLE 2-continued

| Tc | 3000 K |
| --- | --- |
| Duv | −0.03 |
| (x, y) | (0.43685, 0.40396) |

| Color rendering index | |
| --- | --- |
| Ra | 94.4 |
| R1 | 99.0 |
| R2 | 96.7 |
| R3 | 94.9 |
| R4 | 93.2 |
| R5 | 99.0 |
| R6 | 90.9 |
| R7 | 93.6 |
| R8 | 88.3 |
| R9 | 69.7 |
| R10 | 98.1 |
| R11 | 80.2 |
| R12 | 83.7 |
| R13 | 97.4 |
| R14 | 98.1 |
| R15 | 91.7 |

| Gamut ratio | |
| --- | --- |
| Ga | 102.6 |
| Ga4 | 106.4 |

Figure 9A:
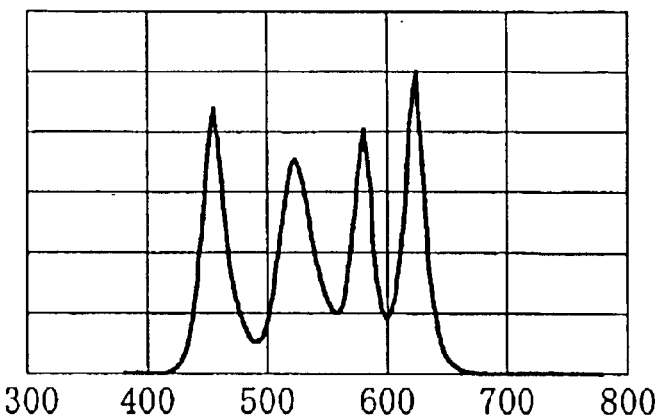
FIG. 9A is a graph illustrating a spectral distribution of the LED illumination light source with optimized color reproducibility where the light source has a correlated color temperature of 5000 K.
Figure 9B:
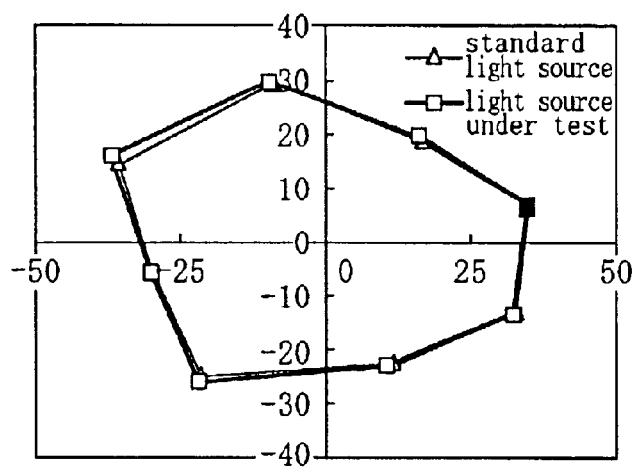
FIGS. 9B and 9C are graphs illustrating its gamut ratios Ga and Ga4, respectively.
Figure 9C:
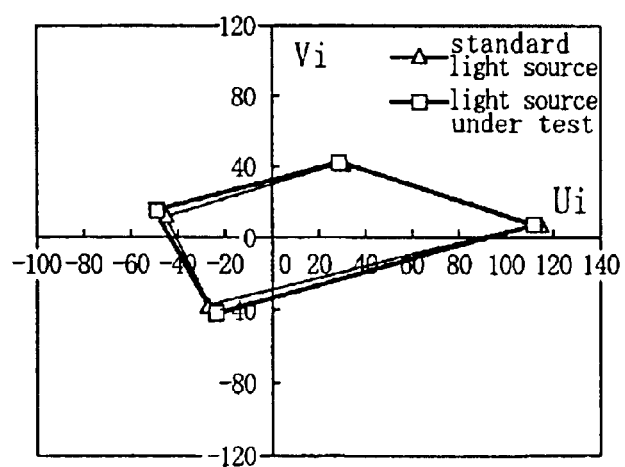

Like FIG. 8A, FIG. 9A illustrates a spectral distribution of an LED illumination light source with optimized color reproducibility, in which the illumination light source has an intermediate correlated color temperature of 5000 K. The correlated color temperature of 5000 K is the point at which the standard source for calculating Ra is switched from a blackbody source to an artificial daylight source. In this example, the peak wavelengths of the LEDs 11, 12, 13 and 14 are 455 nm, 525 nm, 580 nm and 625 nm, respectively, and their luminous flux ratios are 3.54, 47.25, 30.86 and 18.34, respectively FIGS. 9B and 9C respectively illustrate the gamut ratios Ga and Ga4. Like Table 2, the following Table 3 shows not only these parameters but also the chromaticity coordinates (x, y), Duv, color rendering indices (Ra and R1 through R15) and gamut ratios of the LED illumination light source shown in FIGS. 9A, 9B and 9C:

TABLE 3

| LED type | Peak wavelength | Luminous flux ratio |
| --- | --- | --- |
| Blue LED 11 | 455 nm | 3.54 |
| Blue-green LED 12 | 525 nm | 47.25 |
| Orange LED 13 | 580 nm | 30.86 |
| Red LED 14 | 625 nm | 18.34 |
| Tc | 5000 K | |
| Duv | 0.03 | |
| (x, y) | (0.34519, 0.35176) | |

| Color rendering index | |
| --- | --- |
| Ra | 95.8 |
| R1 | 97.9 |
| R2 | 95.3 |
| R3 | 96.2 |
| R4 | 91.6 |
| R5 | 99.1 |
| R6 | 93.6 |
| R7 | 95.8 |
| R8 | 96.9 |
| R9 | 86.7 |
| R10 | 92.5 |
| R11 | 80.2 |
| R12 | 69.8 |
| R13 | 97.6 |

TABLE 3-continued

| | |
|---|---|
| R14 | 96.6 |
| R15 | 95.0 |
| Gamut ratio | |
| Ga | 104.2 |
| Ga4 | 108.7 |

Figure 10A:
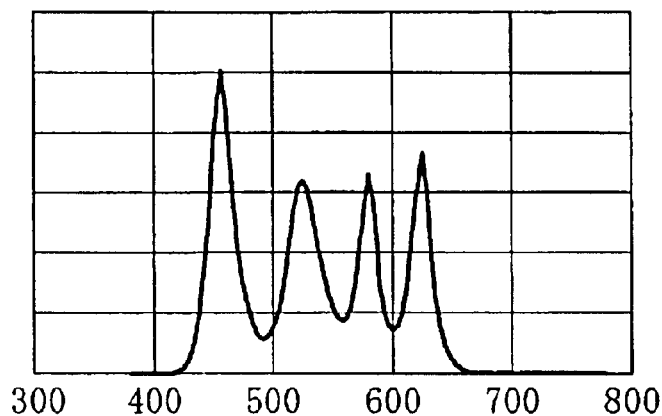
FIG. 10A is a graph illustrating a spectral distribution of the LED illumination light source with optimized color reproducibility where the light source has a correlated color temperature of 6700 K.
Figure 10B:
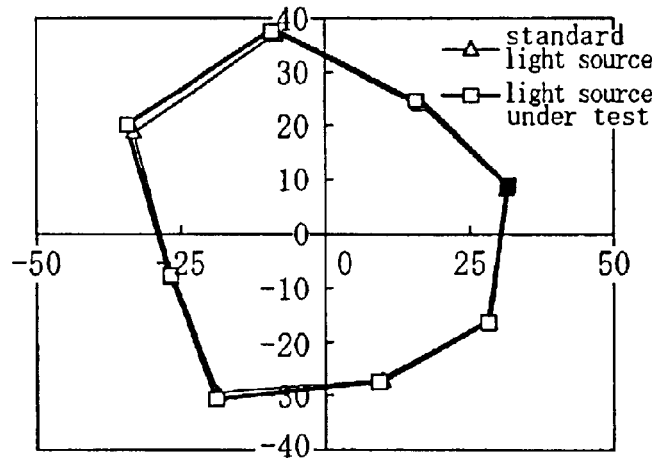
FIGS. 10B and 10C are graphs illustrating its gamut ratios Ga and Ga4, respectively.
Figure 10C:
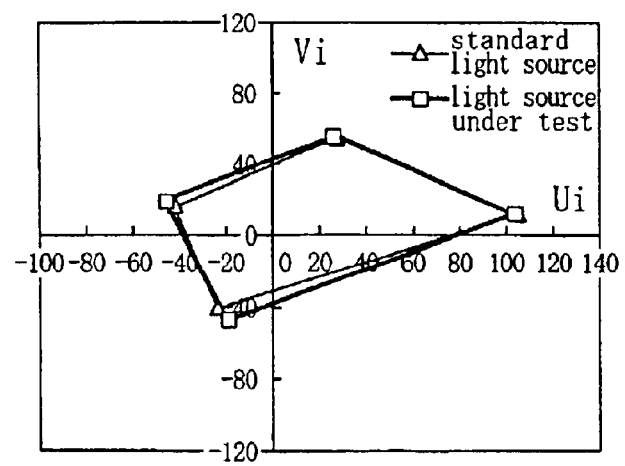

FIG. 10A illustrates a spectral distribution of an LED illumination light source with optimized color reproducibility, in which the correlated color temperature is 6700 K, which is close to the upper limit of correlated color temperatures for an everyday illumination light source. At 6700 K, an artificial daylight source is used as a standard source for calculating Ra. In this example, the peak wavelengths of the LEDs 11, 12, 13 and 14 are 455 nm, 525 nm, 580 nm and 625 nm, respectively, and their luminous flux ratios are 4.80, 50.02, 29.46 and 15.72, respectively Like Table 2, the following Table 4 shows not only these parameters but also the chromaticity coordinates (x, y), Duv, color rendering indices (Ra and R1 through R15) and gamut ratios of the LED illumination light source shown in FIGS. 10A, 10B and 10C:

TABLE 4

| LED type | Peak wavelength | Luminous flux ratio |
|---|---|---|
| Blue LED 11 | 455 nm | 4.80 |
| Blue-green LED 12 | 525 nm | 50.02 |
| Orange LED 13 | 580 nm | 29.46 |
| Red LED 14 | 625 nm | 15.72 |
| Tc | 6700 K | |
| Duv | −0.02 | |
| (x, y) | (0.31046, 0.32059) | |
| Color rendering index | | |
| Ra | 95.7 | |
| R1 | 96.8 | |
| R2 | 95.1 | |
| R3 | 94.2 | |
| R4 | 93.7 | |
| R5 | 97.2 | |
| R6 | 92.4 | |
| R7 | 97.3 | |
| R8 | 99.0 | |
| R9 | 93.5 | |
| R10 | 90.9 | |
| R11 | 81.8 | |
| R12 | 62.0 | |
| R13 | 97.4 | |
| R14 | 95.5 | |
| R15 | 94.6 | |
| Gamut ratio | | |
| Ga | 103.6 | |
| Ga4 | 109.6 | |

For comparison, an example of an LED illumination light source without optimized color reproducibility will be described with reference to FIGS. 11A through 11C and Table 5.

Figure 11A:
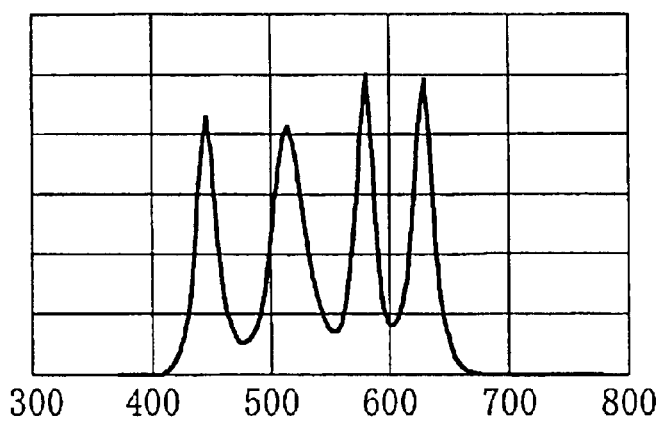
FIG. 11A is a graph illustrating a spectral distribution of the LED illumination light source where the light source has a correlated color temperature of 5000 K.

Like FIG. 9A, FIG. 11A illustrates a spectral distribution of an LED illumination light source which has an intermediate correlated color temperature of 5000 K, and the standard source is an artificial daylight source. In this example, the peak wavelengths of the LEDs 11, 12, 13 and 14 are 445 nm, 515 nm, 580 nm and 630 nm, respectively, and their luminous flux ratios are 2.01, 43.06, 39.10 and 15.82, respectively.

Figure 11B:
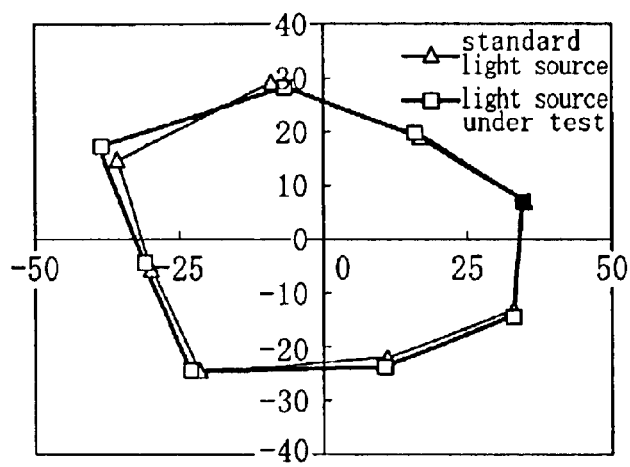
FIGS. 11B and 11C are graphs illustrating its gamut ratios Ga and Ga4, respectively.
Figure 11C:
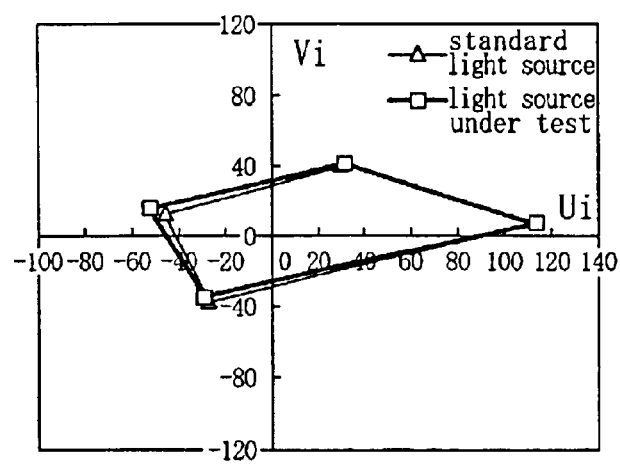

FIGS. 11B and 11C respectively illustrate the gamut ratios Ga and Ga4. The following Table 5 shows not only these parameters but also the chromaticity coordinates (x, y), Duv, color rendering indices (Ra and R1 through R15) and gamut ratios of the LED illumination light source shown in FIGS. 11A, 11B and 11C:

TABLE 5

| LED type | Peak wavelength | Luminous flux ratio |
|---|---|---|
| Blue LED 11 | 455 nm | 2.01 |
| Blue-green LED 12 | 515 nm | 43.06 |
| Orange LED 13 | 580 nm | 39.10 |
| Red LED 14 | 630 nm | 15.82 |
| Tc | 5000 K | |
| Duv | 0.08 | |
| (x, y) | (0.34525, 0.35190) | |
| Color rendering index | | |
| Ra | 91.5 | |
| R1 | 97.1 | |
| R2 | 95.9 | |
| R3 | 86.8 | |
| R4 | 83.0 | |
| R5 | 92.2 | |
| R6 | 91.4 | |
| R7 | 91.2 | |
| R8 | 94.1 | |
| R9 | 98.1 | |
| R10 | 88.2 | |
| R11 | 64.5 | |
| R12 | 90.4 | |
| R13 | 94.8 | |
| R14 | 90.3 | |
| R15 | 87.8 | |
| Gamut ratio | | |
| Ga | 105.4 | |
| Ga4 | 103.6 | |

For the optimization of the color reproducibility described in this embodiment, the inventors of the present invention combined the spectral distributions of the actual LEDs at wavelength intervals of 5 nm for various correlated color temperatures into a matrix, and verified the optimum value by mathematical programming (simplex method). Furthermore, during the optimization of the color reproducibility, for similar values of Ra, Ga and Ga4, the optimization was performed by plotting the chromaticity coordinates of the various evaluation color chips as shown for example in FIG. 8B, and selecting the combination with the minimum color shift in a rotation direction (e.g., clockwise) with respect to the point of origin. By adding this condition, undesirable color shifts in a certain hue direction can be suppressed. Based on the results shown in FIGS. 8A through 11C and Tables 2 through 5, the findings of the inventors will be further detailed.

1. When the emission peak of the blue LED 11 was set to less than 450 nm, blue test colors were reproduced too brilliantly, and thus it was found that Ga and Ga4 were high, whereas Ra was low. On the other hand, when the emission peak of the blue LED 11 was set to greater than 470 nm, blue test colors looked paler and were not reproduced accurately, and thus it was found that Ga, Ga4 as well as Ra were low. In addition, the interval between the emission peaks of blue and blue-green emissions became so narrow that a color shift into a hue direction between the blue and blue-green color chips became large. As a result, it was found that it is preferable to set the interval between the blue and blue-green emission peaks from about 60 nanometers to about 70 nanometers, which is an important point for increasing Ra.

It should be noted that if the object is only to achieve a higher Ra without realizing a light source that uses the same LEDs at any color temperatures and realizes a high color rendering performance just by changing the luminous intensities of these LEDs, then the wavelength range for the blue LED 11 can be relaxed and can be set to from 420 nm to 470 nm.

2. To increase the Ra index, it is advantageous to set the emission peak of the blue-green LED 12 to a relatively long wavelength of around 530 nm. However, it was found that if the emission peak was shifted toward longer wavelengths of at least 530 nm, e.g. to 540 nm or 550 nm, then Ra tended to decrease. In addition, when the emission wavelength of the blue-green LED 12 is greater than 540 nm, the industrial yield of the LEDs represented by the GaN-based LEDs may be reduced. Furthermore, since the interval between the emission peaks of the blue LED 11 and the blue-green LED 12 is preferably about 60 nanometers to about 70 nanometers, the lower limit of the emission peak of the blue-green LED 12 is preferably set to at least 500 nm, or even 510 nm if a higher color rendering performance is desired. Herein, when not only efficiency in photopic vision but also improvement of effective brightness in mesopic vision or scotopic vision are desired, the emission peak of the blue-green LED 12 may be consciously set to around about 505 nm, because at this wavelength, there is a peak in the light sensitivity of human rod visual cells.

3. To increase the Ra, it is advantageous to set the emission peak of the orange LED 13 to a relatively short wavelength of around 570 nm to 600 nm. It was found that if the emission peak wavelength of the orange LED 13 was set lower than that, then Ra tended to decrease. Once the emission wavelength of the orange LED 13 becomes less than 580 nm, industrial productivity of the LEDs represented by AlInGaP-based LEDs decreases. Furthermore, if the emission wavelength becomes less than 570 nm, then their industrial productivity decreases even further. On the other hand, if the emission peak of the orange LED 13 becomes greater than 600 nm, then the interval between the emission peaks of the blue-green LED 12 and the orange LED 13 becomes too wide, whereas the interval between the emission peaks of the orange LED 13 and the red LED 14 becomes too narrow. Thus, the Ga and Ga4 distributions are deformed into a certain hue direction. As a result, Ra decreases.

4. To increase Ra, it is advantageous to set the emission peak of the red LED 14 to around 620 nm to 630 nm. The lower limit of the emission peak of the red LED 14 should be loosely speaking 610 nm, and strictly speaking 625 nm, which is the midpoint between 620 and 630 nm. When it was set to greater than 650 nm, red test colors were reproduced too brilliantly, and thus it was found that Ga and Ga4 were high whereas Ra was low. On the other hand, when it was set to less than 625 nm, red test colors looked paler and were not reproduced accurately, so that Ga, Ga4 as well as Ra were found to be low.

It should be noted that if the object is only to achieve a higher Ra without realizing a light source that uses the same LEDs at various color temperatures and realizes a high color rendering performance just by changing the luminous intensities of these LEDs, then this wavelength range can be relaxed and can be set to from 610 nm to 660 nm. Here it was found that, in particular when only a light source with relatively low color temperature using a blackbody source as the standard source is to be realized, the optimal solution was uniquely shifted. Accordingly, it was determined that when the emission peak wavelength of the red LED 14 was set to a long wavelength of greater than 630 nm within the peak wavelength range of the red LED 14, a higher Ra could be attained. This phenomenon was conspicuous when the object was a light source with low color temperature using a blackbody source as the standard source.

As can be seen from FIGS. 11A through 11C and Table 5, in this example, since the emission peak of the orange LED 13 is higher than that of the red LED 14, the value of Ga4 is lower than that of Ga, even though Ra has a favorable value greater than 90. This means that Ga is so high that accurate color reproducibility with respect to colors with intermediate degrees of saturation, which should be reproduced subtly and precisely, may be slightly decreased. It should be noted that if the main purpose is to illuminate an object more colorful and brilliantly, then Ga can be high and Ra does not have to be increased more than necessary, so that it is also possible to use a light source as illustrated in FIG. 11. Consequently, the range at which such an LED illumination light source can be realized becomes even broader than the aforementioned optimized ranges.

Embodiment 3

Figure 12:
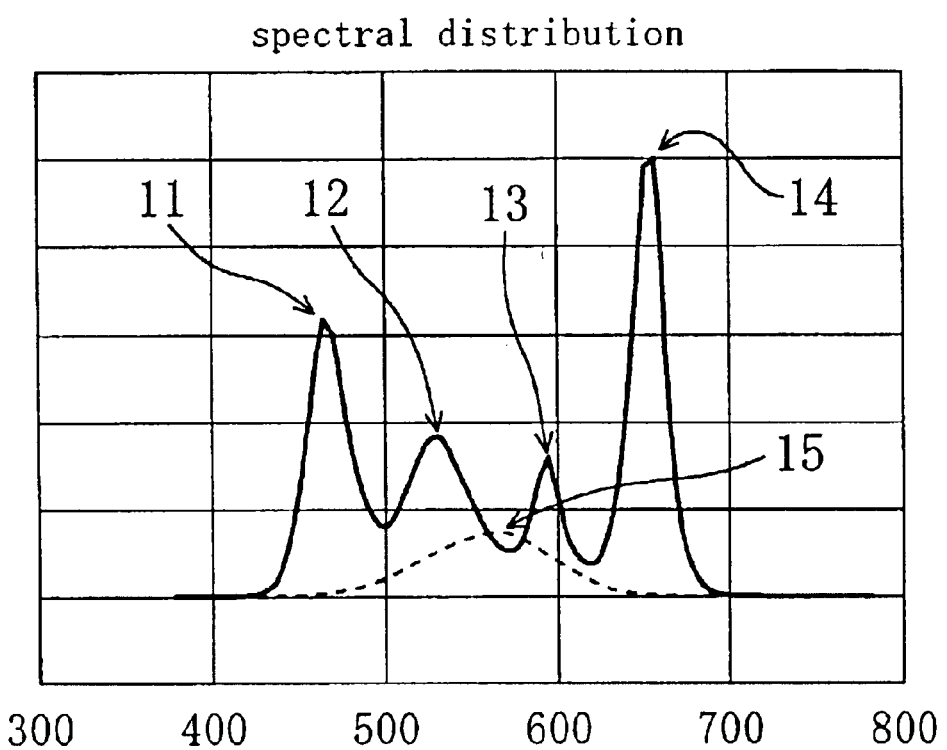
FIG. 12 is a graph schematically illustrating a spectral distribution of the LED illumination light source according to Embodiment 3.

An illumination light source according to Embodiment 3 of the present invention is described with reference to FIG. 12. FIG. 12 schematically illustrates the spectral distribution of the LED illumination light source according to this embodiment.

The LED illumination light source of this embodiment includes not only the blue LED 11, the blue-green LED 12, the orange LED 13 and the red LED 14 of the foregoing Embodiments 1 and 2, but also a phosphor 15 that emits light when excited by the emissions of the LEDs. The emission spectrum of the phosphor 15 is broader than the emission spectra of the LEDs 11 through 14. Thus, with the phosphor 15, the emission colors of the LEDs 11 through 14 can be mixed favorably. Moreover, when the phosphor 15 is provided around the LEDs 11 through 14, the emission colors of the LEDs 11 through 14 can be mixed much more favorably by dispersion with the phosphor 15.

The phosphor 15 of this embodiment is excited by the emission of the blue LED 11 and emits light of colors in a range between green and yellow. For example, the phosphor 15 can be a yellow or green emitting phosphor. There is no limitation to exciting the phosphor 15 with the blue LED 11, and the phosphor 15 may also be excited by the emission of the blue-green LED 12, for example. For the phosphor 15, it is possible to use a YAG phosphor or an inorganic phosphor including Mn luminescent centers. Furthermore, there is no limitation to inorganic phosphors, and it is also possible to use organic phosphors.

As can be seen from FIG. 12, by providing the phosphor 15, it is possible to supplement the spectrum at the emission wavelengths at which the LEDs 11 through 14 are insufficient. The phosphor 15 has a broad emission spectrum with a wide half-width, so that the half-width of the phosphor 15 in this embodiment is wider than the half-widths of the LEDs 11 through 14 (e.g., LED 11). Thus, the emission spectrum of the phosphor 15 covers a wide wavelength range of 50 nanometers or more.

Since the illumination light source of this embodiment includes the phosphor 15, color fluctuations can be suppressed such that the color of the emitted light does not fluctuate even when the lighting conditions of the respective LEDs 11 through 14 change. That is to say, since the LEDs have emission spectra covering narrow wavelength ranges, when the lighting conditions of the LEDs 11 through 14 of various colors change, the color of the emitted light may fluctuate significantly, and as a result it becomes difficult to control. However, by combining the emissions of the LEDs with the emission of the phosphor 15, which emits in a wide wavelength range, fluctuations of the emitted light color that may be caused by a change in the lighting conditions of the LEDs of the various colors can be suppressed.

Embodiment 4

Figure 13:
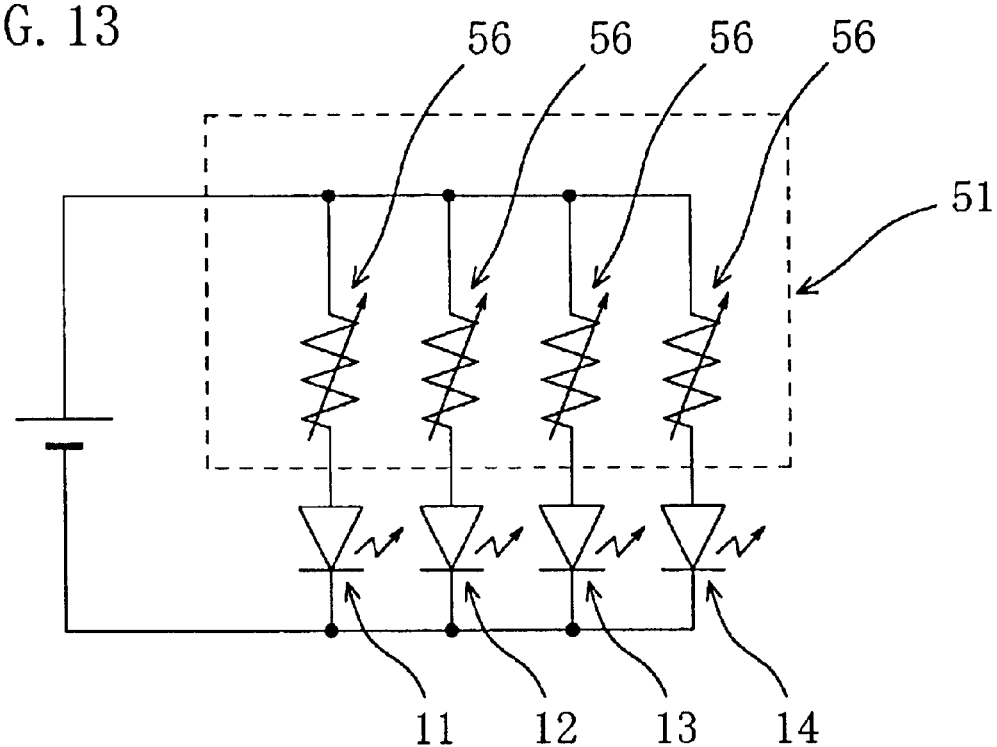
FIG. 13 schematically illustrates a circuit structure for an LED illumination light source according to Embodiment 4.

An illumination light source according to Embodiment 4 of the present invention is described with reference to FIGS. 13 and 14. FIG. 13 schematically illustrates a circuit structure for the LED illumination light source according to this embodiment.

With a circuit structure as shown in FIG. 13, it is possible to realize the LED illumination light sources of the foregoing Embodiments 1 through 3 as a light source producing light in variable colors.

The circuit 51 shown in FIG. 13 includes luminous intensity control means (luminous intensity control devices) 56 for controlling the luminous intensities of each of the blue LED 11, the blue-green LED 12, the orange LED 13 and the red LED 14, and is thus provided with a function for controlling the luminous intensity of the various LEDs. In other words, the luminous intensity control means 56 can control the luminous intensity ratio (luminous flux ratio) of each of the LEDs 11 through 14. In this embodiment, variable resistors are used as the luminous intensity control means 56.

Any means that can vary the power supplied to each of the LEDs may be used as the luminous intensity control means 56. Consequently, there is no limitation to variable resistors, and it is also possible to use means for switching fixed resistors, means using ladder resistors, means using frequency control, means using duty cycles for lighting the lamp, means for changing the number of LEDs coupled as loads seen from the power supply, or means for switching the connection scheme.

Figure 14:
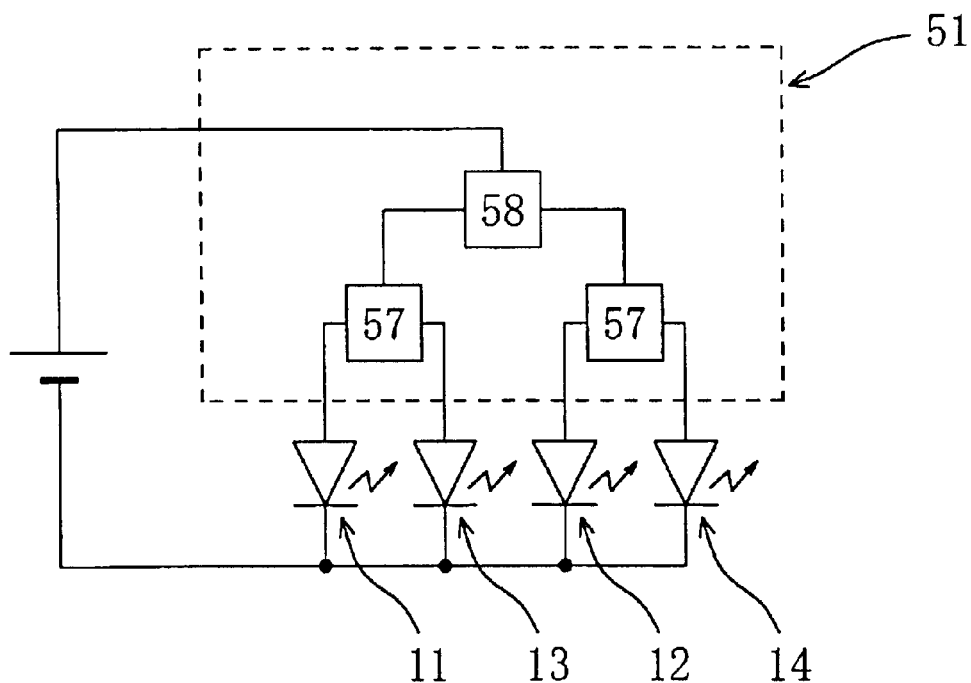
FIG. 14 schematically illustrates another circuit structure for an LED illumination light source according to Embodiment 4.

The circuit structure illustrated in FIG. 14 is a modification of the circuit structure illustrated in FIG. 13. As shown in FIG. 14, when the blue LED 11 is paired off with the orange LED 13 and the blue-green LED 12 is paired off with the red LED 14, the number of the luminous intensity control means (luminous intensity control devices) can be decreased, so that the circuit structure can be simplified. The LEDs are paired off in such a manner that the colors of the LEDs of each pair are complementary to each other. With this structure, both of the luminous intensity control means 57 of a first stage seen from the LEDs also take over the operation of comparators comparing the GaN-based LEDs with the AlInGaP-based LEDs, and this operation is further compared and controlled by a luminous intensity control means 58 of a second stage seen from the LEDs. Thereby, the operations of the circuit can be separated into two comparing operations of comparing the GaN-based LEDs with the AlInGaP-based LEDs and one operation of comparing the respective comparing operations. Consequently, the operation of the LED illumination light source of the present invention becomes reliable and simple. Various circuits are conceivable for the operation described above, and a typical example is a feedback circuit using comparators.

According to the circuit structure of this embodiment, the luminous intensity ratio of the LEDs (11 through 14) can be controlled, so that light of any color can be produced. In addition, with this structure, also the brightness of the illumination light source can be easily controlled because the luminous intensity of the various LEDs can be varied.

It should be noted that the illumination light source does not have to be formed by providing the LEDs 11 through 14 of the various emission colors as independent elements and then combining them. It is also possible to arrange the LEDs 11 through 14 in a single LED element. When the LEDs 11 through 14 are integrated into a single element, color irregularities can be reduced. That is to say, compared to providing the LEDs 11 through 14 of the various colors serving as the light sources individually, and emitting light at spatially discrete positions, color irregularities can be reduced when the LEDs 11 through 14 are integrated into a single element.

On the other hand, the illumination light source also can be made by producing the LEDs 11 through 14 as individual elements and assembling them together in a single unit. This structure is advantageous in that the design process of each of the LED elements can be optimized separately. Moreover, it is possible to pick and assemble together only the good LED elements into one unit, which makes it possible to increase the production yield. Furthermore, even when the output flux of the LEDs of the respective emission colors is different, since the LEDs are provided as independent elements, the LEDs can be assembled together in any desired ratio, increasing the design freedom of the lamp. As a result, even though the respective luminous fluxes of the LEDs 11 through 14 differ, an illumination light source exhibiting good properties can be provided easily. In other words, compared to grouping elements in which the LEDs (11 through 14) of respective emission colors are assembled at a fixed ratio in one element, this arrangement can increase the design freedom of the lamp.

Embodiment 5

Figure 15:
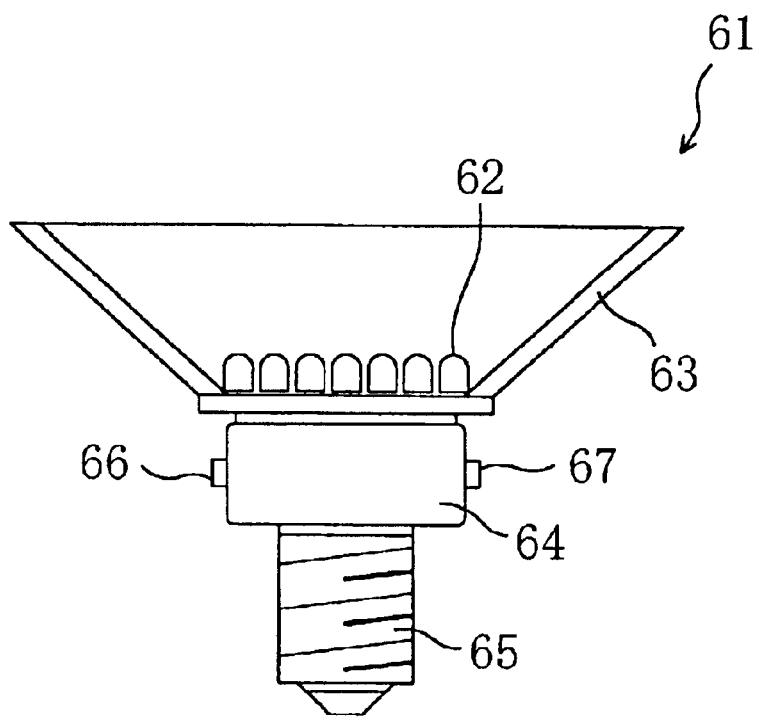
FIG. 15 schematically illustrates the structure of an illumination light source (lamp unit) 61 according to Embodiment 5.

An illumination light source according to Embodiment 5 of the present invention is described with reference to FIG. 15. FIG. 15 schematically illustrates the structure of an LED illumination light source 61 according to this embodiment.

The LED illumination light sources of any of the foregoing Embodiments 1 through 4 may be combined with a power supply 64 for supplying power to the LEDs (11 through 14) to form a unit (lamp unit or illumination apparatus) as shown in FIG. 15.

The lamp unit 61 of this embodiment includes LED chips 62 including one or more, or all of the LEDs 11 through 14 of the foregoing embodiments; a reflector 63 for reflecting the light emitted from the LED chips 62; a power supply 64 for supplying power to the LED chips 62; and a base 65 coupled to the power supply 64.

One or more LED chips 62 can be arranged on the bottom of the reflector 63, and typically about 10 to 200 are provided. Furthermore, if the reflector 63 is thermally coupled to the LED chips 62, then the reflector 63 can function as a heat sink contributing to the dissipation of heat from the LED chips 62. As a result, the lifetime of the LED chips 62 can be increased. As the reflector 63, either a diffuse reflector (e.g., white light reflector) or a mirror reflector (or reflective mirror) may be used.

The inventors confirmed that a lamp unit 61 including about 60 LED chips 62 had a beam flux (i.e., the amount of luminous flux included within a beam angle) of 60 lm, a lifetime of 10000 hours and a luminous efficacy of about 30 to 50 lm/W. As can be seen, this performance is much better than that of a conventional lamp unit (with a beam flux of about 60 lm, a lifetime of 2000 hours and a luminous efficacy of about 15 lm/W) in which conventional halogen electric lamps are combined with a dichroic mirror. Also, the LED chip 62 included in the lamp unit 61 are semiconductor devices so that there is also the advantage of easy handling.

Moreover, compared to the similar conventional lamp units combining the three wavelengths corresponding to blue, green and red and having general color rendering indices Ra as low as 20 at respective correlated color temperatures (e.g., 3000 K and 5000 K), the lamp unit 61 of this embodiment, which combines LEDs emitting at four wavelength ranges corresponding to blue, blue-green, orange and red, can achieve a general color rendering index Ra of about 95 at various correlated color temperatures. Furthermore, the arrangement according to aforementioned Embodiment 4 can be used to provide a lamp unit 61 according to the present embodiment, whose color can be changed. In this case, the luminous intensity control means (luminous intensity control devices) 51 shown in FIG. 13 may be provided in the power supply 64.

In addition, when the power supply 64 is thermally shielded from the LED chips 62 by insulating means such as insulating materials, the heat generated by the power supply 64 and transmitted to the LED chips 62 can be decreased. Thereby, overheating of the LEDs 62 can be prevented.

In this embodiment, the power supply 64 can be provided with an AC/DC converter, for example. In the example illustrated in FIG. 15, the power supply 64 is equipped with a light color control switch 66 and a brightness control dial 67 so that the color and the brightness of the illumination light can be controlled with these dials 66 and 67.

In this embodiment, a lamp unit 61 provided with a reflector 63 and a base 65 has been described, but there is no limitation to this structure. Alternatively, the lamp unit 61 may or may not include the reflector 63 and the base 65 depending on its intended application. Furthermore, a single unit consisting of about 60 LED chips 62 may be used as a single light source. Furthermore, it is also possible to use a plurality of those units. The LED chips 62 illustrated in FIG. 15 are through-hole type bullet-shaped elements, but, the shape of these elements can be realized in various manners. For example, the LED chips 62 may be chip-like devices for surface mounting, or LED bare chips may be mounted directly on a substrate.

Embodiment 6

Figure 16A:
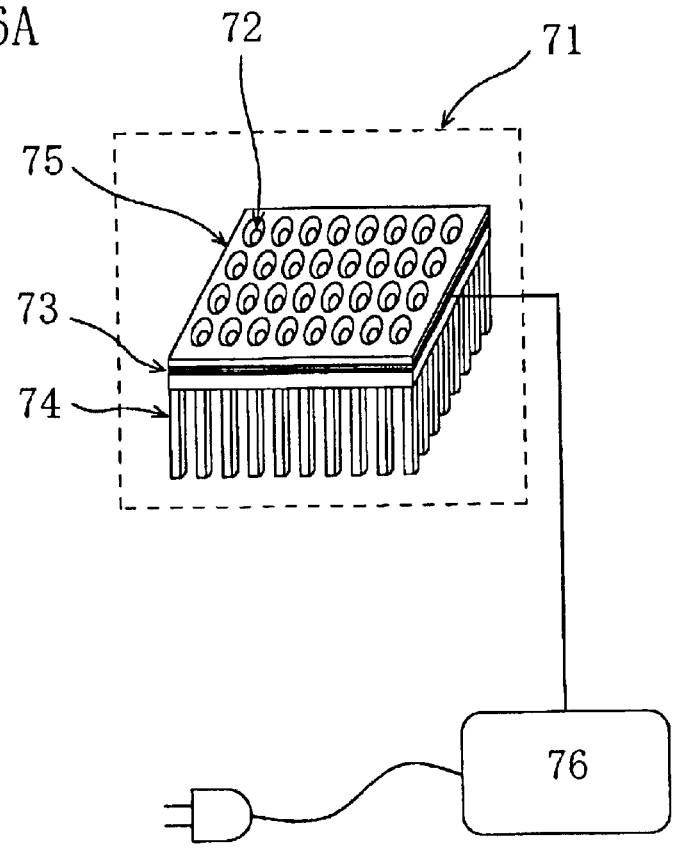
FIGS. 16A and 16B schematically illustrate the structure of an illumination light source (lamp unit) 71 according to Embodiment 6.
Figure 16B:
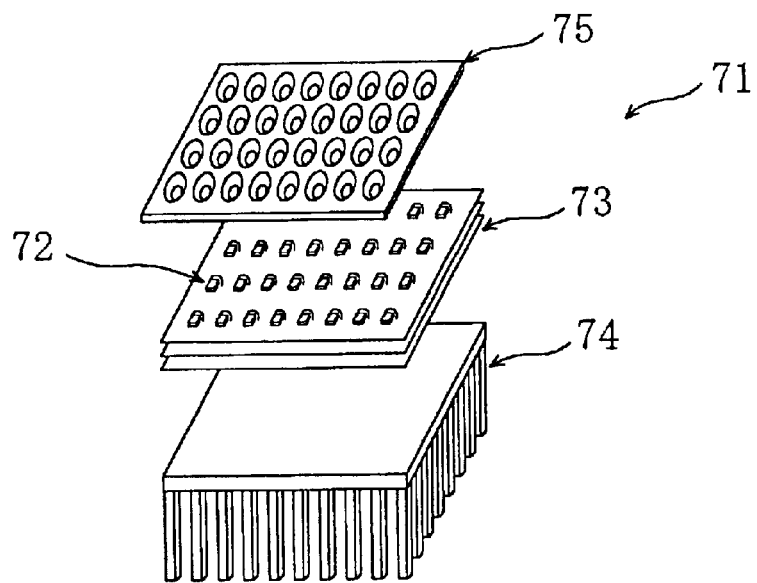

An illumination light source according to Embodiment 6 of the present invention is described with reference to FIGS. 16A and 16B.

The LED illumination light sources of any of the foregoing Embodiments 1 through 5 may be realized as a unit in which the LED chips are mounted on a heat-dissipating substrate combined with a power supply supplying power to the LED chips. FIGS. 16A and 16B schematically illustrate the structure of a lamp unit (LED illumination light source) 71 according to this embodiment.

The lamp unit 71 of this embodiment includes LED chips 72 including one or more or all of the LEDs 11 through 14 of the foregoing embodiments; a heat-dissipating substrate 73 on which the LED chips 72 are mounted; a heat sink 74 for dissipating the heat generated by the heat-dissipating substrate 73; a reflector 75 for reflecting the light emitted by the LED chips 72; and a power supply 76 for supplying power to the LED chips 72.

One or more LED chips 72 can be arranged on the heat-dissipating substrate 73, and typically about 10 to 200 can be provided. In this embodiment, the LED chips 72 are bare chips. If the LED chips 72 are thermally coupled to the heat sink 74, then the heat sink 74 can contribute to dissipating the heat generated by the LED chips 72. As a result, the lifetime of the LED chips 72 can be increased. Examples of a substrate suitable for use as the heat-dissipating substrate 73 include glass epoxy substrates, composite substrates and ceramic substrates. Preferably, these substrates include a metal base, which further improves the heat dissipation performance. Moreover, these substrates also can be multi-layered substrates.

As the reflector 73, either a diffuse reflector (e.g., white light reflector) or a mirror reflector (reflective mirror) may be used. The reflector 73 does not have to be provided separately, and it is also possible to finish the surface of the heat-dissipating substrate 73 in white or in mirror finish so as to provide a diffuse reflector or a mirror reflector (reflective mirror).

Embodiment 7

Hereinafter, an illumination light source according to Embodiment 7 of the present invention is described with reference to FIGS. 16A and 16B. The illumination light source of this embodiment is different from those of foregoing Embodiments 1 through 6 in that the light-emitting sites of the blue LEDs 11 and the light-emitting sites of the orange LEDs 13 are provided within one LED chip whereas the light-emitting sites of the red LEDs 14 and the light-emitting sites of the blue-green LEDs 12 are provided within another LED chip. Other aspects are similar to the above-described embodiments, so that their further description will be omitted or simplified herein for the sake of simplicity. It should be noted that this embodiment can be combined with any of the foregoing Embodiments 1 through 6.

In the illumination light source of this embodiment, the LED layers of the blue LED 11 and the orange LED 13 are integrated into one LED bare chip, whereas the LED layers of the blue-green LED 12 and the red LED 14 are integrated into another LED bare chip. Such a configuration that requires only two bare chips is advantageous compared to a configuration requiring four bare chips of four corresponding different colors disposed side by side. The colors of the two types of LEDs in each bare chip are complementary to each other and the emission sites are arranged as close together as possible on the same LED bare chip, which is advantageous for the mixing of colors. In addition, these two light-emitting sites are thermally coupled together more strongly and the temperatures of the two LED layers are closer to one other, so that these sites can be regarded as substantially thermally identical. As a result, there is the advantage that it is easier to perform feedback control over the effect of heat on the optical output.

Furthermore, the blue and orange emissions are produced by combining GaN-based and AlInGaP-based luminescent materials, and the blue-green and red emissions can be produced by combining GaN-based and AlInGaP-based luminescent materials. Thus, the combinations of the luminescent materials of the respective bare chips, coupled into one, can be the same. Accordingly, since the combination of materials can be the same, it becomes much easier to perform feedback control over the effect of heat.

A process for manufacturing an LED bare chip having two LED layers is explained with reference to FIGS. 17A through 17C.

Figure 17A:
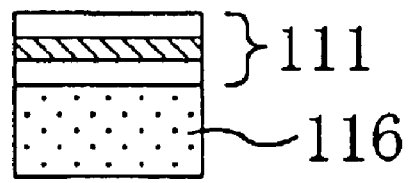
FIGS. 17A through 17C are cross-sectional views illustrating the process steps for fabricating a single LED bare chip.

First, as shown in FIG. 17A, a first LED layer 111, including at least a p-type semiconductor layer, an n-type semiconductor layer and an active layer, is formed on a substrate 116 for LED film formation.

Figure 17B:
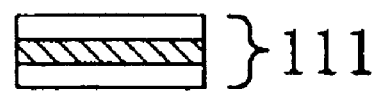

Next, as shown in FIG. 17B, the substrate 116 is removed, thus obtaining the first LED layer 111. To remove the substrate 116, any appropriate technique may be selected depending on the types of the substrate 116 and the LED layer 111. For example, the substrate 116 may be gradually removed by a polishing process, lifted off mechanically, etched away, peeled off by thermal stress or by using laser beams, microwaves or the like.

Figure 17C:
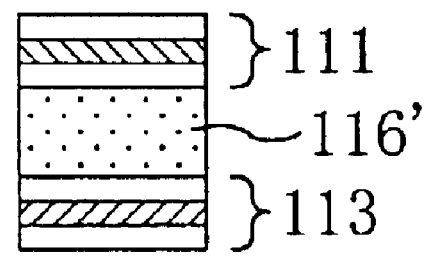

Then, as shown in FIG. 17C, the first LED layer 111 is bonded to a substrate 116', on which another LED layer 113 has been formed. In this manner, an LED bare chip emitting at two emission colors can be obtained. That is to say, either the first LED layer or the other LED layer or both are separated, and then bonded together, obtaining one LED bare chip. In this example, different types of the LED layers are bonded together primarily However, it is of course also possible to bond together LED layers made of the same compounds. The LED layers can be bonded together by vacuum bonding using a high vacuum, adhered to each other with an adhesive agent, bonded together by pressure or bonded together by heat. It is further possible to use these methods in combination.

Next, examples of methods of bonding LED layers to a substrate will be described with reference to FIGS. 18A through 21C. The LED layers may be bonded in a variety of ways, but only typical ones will be exemplified in the following. It should be noted that the LED layers of the blue LED 11, the blue-green LED 12, the orange LED 13 and the red LED 14 are denoted as the LED layers 111, 112, 113 and 114, respectively, for convenience sake. It is also possible to form the phosphor 15 of Embodiment 3 around the of the LED layers 111, 112, 113 and 114.

Figure 18A:
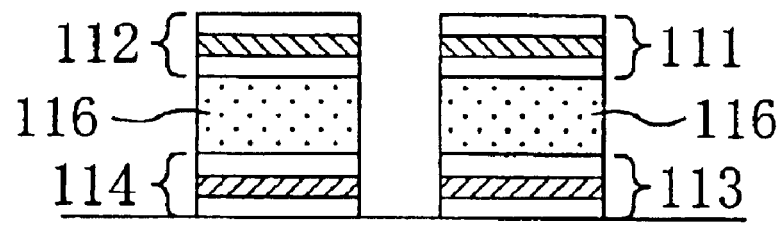
FIGS. 18A through 18C are cross-sectional views illustrating various cross-sectional structures for LED bare chips according to Embodiment 7.

FIG. 18A illustrates an example of a double-sided electrode structure, in which the substrate 116 is conductive. In this structure, one electrode may be formed on the upper surface of each of the upper LED layers (111, 112) and another electrode may be formed on the lower surface of each of the lower LED layers (113, 114), sandwiching the substrate 116.

Figure 18B:
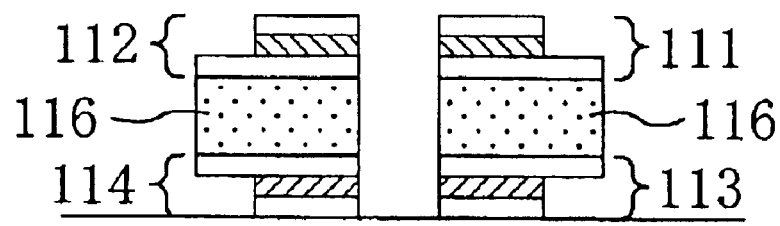

FIG. 18B illustrates an example of a single-sided electrode structure, in which the LED substrate is non-conductive. In this structure, two electrodes may be formed on the upper surfaces of the upper LED layers and two further electrodes may be formed on the lower surfaces of the lower LED layers, sandwiching the substrate 116.

Figure 18C:
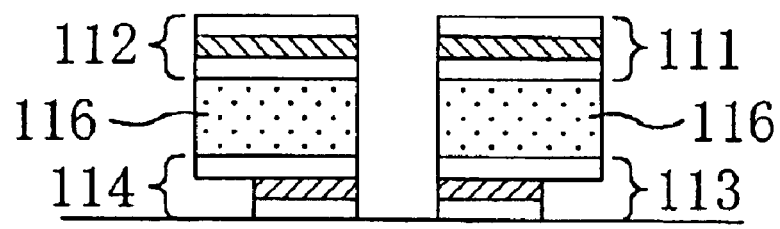

FIG. 18C illustrates a combination of single- and double-sided electrode structures, in which the substrate 116 is conductive. In this structure, one electrode may be formed on the upper surface of the upper LED layers and two electrodes may be formed on the lower surfaces of the lower LED layers, sandwiching the substrate 116.

Figure 19A:
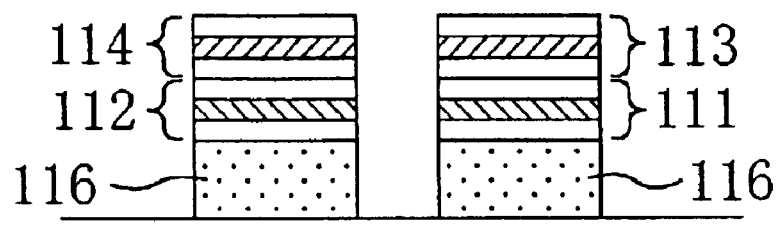
FIGS. 19A through 19C are cross-sectional views illustrating various other cross-sectional structures for LED bare chips according to Embodiment 7.

FIG. 19A illustrates an example in which the substrates 116 are conductive, and the LED layers are stacked one upon the other on the upper surface of the substrates 116. In this structure, one electrode may be provided on the upper surface of the upper LED layers, and another electrode may be formed on the lower surface of the substrates 116.

Figure 19B:
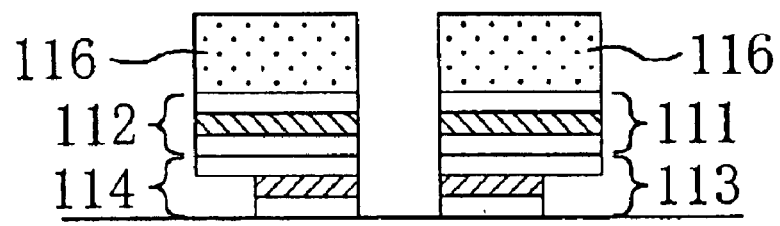

FIG. 19B illustrates an example in which the substrates 116 are conductive, and double-sided electrode and single-sided electrode LED layers are stacked one upon the other on one side of the conductive substrates 116. In this structure, one electrode may be formed on the upper surface of the substrates 116 and two electrodes may be formed on the lower surfaces of the LED layers.

Figure 19C:
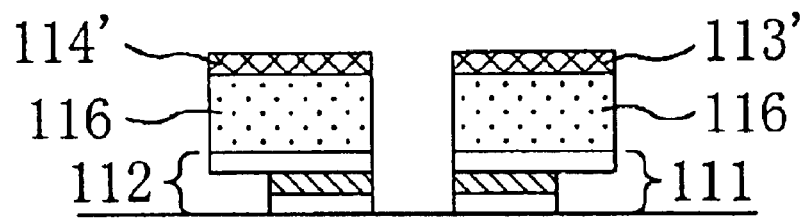

FIG. 19C illustrates an example of a structure in which the LED layers (111 and 112) for producing an emission at a short wavelength are formed on the lower surface of the substrates 116 and the LED active layers (113' and 114') are formed on the upper surface of the corresponding substrates 116. The LED active layers 113' and 114' produce an emission when correspondingly excited by the emission produced from the LED layers 111 and 112 for producing an emission at a short wavelength. In this structure, two electrodes may be formed on the lower surfaces of the LED layers 111 and 112.

The structures shown in FIGS. 18A through 19C are just some examples of the many conceivable combinations, and the combinations of the LED layers may be modified in various other ways. In addition, the structures shown in FIGS. 18C, 19A, 19B and 19C may also be inverted vertically.

Instead of stacking the various LED layers one upon the other on one or two sides of the substrate 116, it is also possible to place the respective two layers of each pair side by side on one side of the same substrate 116. FIGS. 20A through 21C illustrate typical examples of such structures.

Figure 20A:
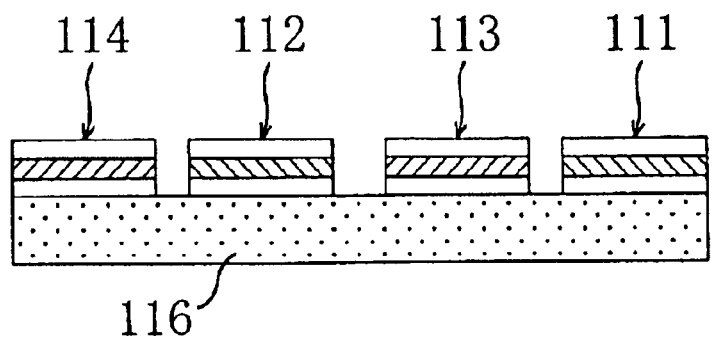
FIGS. 20A through 20C are cross-sectional views illustrating various other cross-sectional structures for LED bare chips according to Embodiment 7.

FIG. 20A illustrates a structure in which the LED layers (111 through 114) of the various colors are mounted side by side on the upper surface of the same conductive substrate 116. In this structure, one common electrode may be formed on the lower surface of the substrate 116 and one electrode each may be provided on the respective upper surfaces of the LED layers 111 through 114.

Figure 20B:
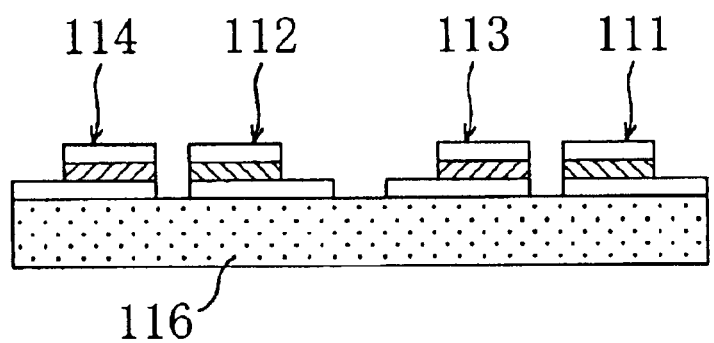

FIG. 20B illustrates a structure in which the four LED layers 111 through 114 of the various colors are mounted side by side on the upper surface of the same non-conductive substrate 116. In this structure, two electrodes may be formed on the upper surfaces of the LED layers 111 through 114.

Figure 20C:
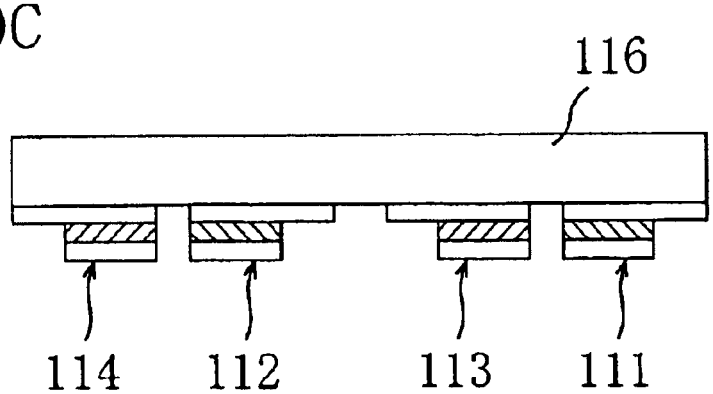

FIG. 20C illustrates a vertically inverted version of the structure shown in FIG. 20B.

Figure 21A:
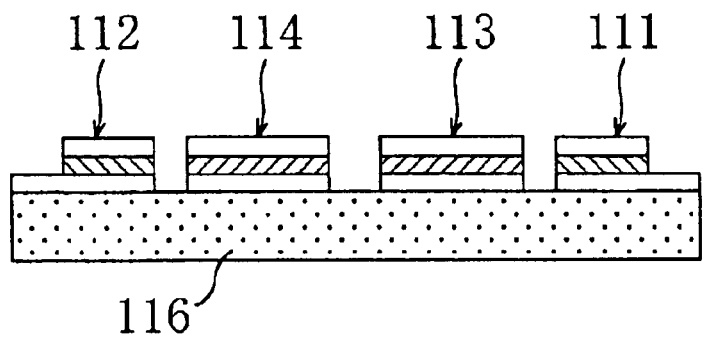
FIGS. 21A through 21C are cross-sectional views illustrating various other cross-sectional structures for LED bare chips according to Embodiment 7.

FIG. 21A illustrates a structure in which the LED layers 111 through 114 of the various colors are mounted side by side on the upper surface of the same conductive substrate 116. In this structure, one common electrode is provided on the lower surface of the substrate 116 and one electrode is formed on the upper surface of each of the LED layers 113 and 114, and two electrodes are formed on the upper surface of each of the LED layers 111 and 112.

Figure 21B:
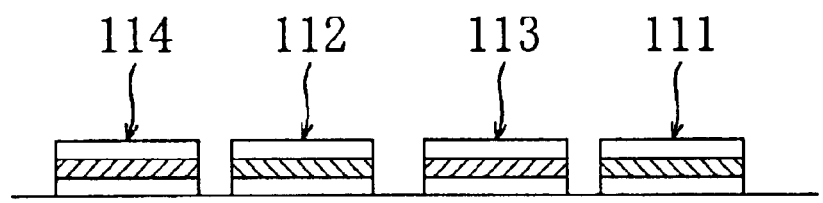

FIG. 21B illustrates a structure in which the four LED layers 111 through 114 are disposed side by side. This structure needs no substrate 116 and there is also no need to perform the bonding process step shown in FIG. 17C.

Figure 21C:
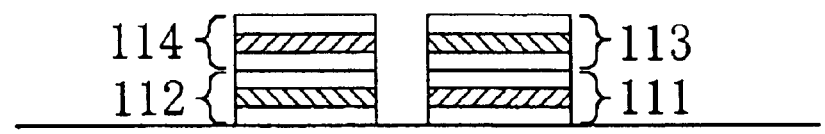

FIG. 21C illustrates a structure in which two LED layers, each including double-sided electrodes, are correspondingly stacked one upon the other. Also in this structure, no substrate 116 is needed. Also, according to this idea, LED layers with single- and/or double-sided electrodes may be stacked in other combinations, or even four LED layers may be stacked one upon the other.

The structures shown in FIGS. 20A through 21C are also just some examples of the many conceivable combinations. The combinations of the LED layers may be modified in various other ways. In addition, the structures shown in FIGS. 20A, 21A and 21B may also be inverted vertically.

As the LEDs used in this embodiment, laser diodes having a DBR (Distributed Bragg Reflector) structure, resonant cavity light-emitting diodes or non-resonant cavity light-emitting diodes can be used. Furthermore, laser diodes having a VCSEL (Vertical Cavity Surface Emitting Laser) structure can be also used.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An illumination light source comprising four types of light-emitting diodes,
   wherein the four types of light-emitting diodes are a blue light-emitting diode emitting blue light having an emission wavelength peak at 420 to 470 nm, a blue-green light-emitting diode emitting blue-green light having an emission wavelength peak at 500 to 550 nm, an orange light-emitting diode emitting orange light having an emission wavelength peak at 570 to 600 nm and a red light-emitting diode emitting red light having an emission wavelength peak at 610 to 660 nm; and the light source having a general color rendering index of at least 90.

2. The illumination light source according to claim 1, wherein the blue light-emitting diode has an emission wavelength peak at 450 to 470 nm;

the blue-green light-emitting diode has an emission wavelength peak at 510 to 540 nm;

the orange light-emitting diode has an emission wavelength peak at 580 to 600 nm; and the red light-emitting diode has an emission wavelength peak at 625 to 650 nm.

3. The illumination light source according to claim 1, wherein the emission wavelength peaks of the four types of light-emitting diodes are different from corresponding hypothetical emission wavelength peaks that are calculated based on results of a theoretical simulation.

4. The illumination light source according to claim 1, wherein, when the illumination light source has a correlated color temperature of less than 5000 K and when a color rendering performance of the illumination light source is evaluated using a blackbody source as a standard source, the illumination light source has a spectral distribution in which the luminous intensities of the blue light-emitting diode, the blue-green light-emitting diode, the orange light-emitting diode and the red light-emitting diode increase in this order.

5. The illumination light source according to claim 2, wherein, when the illumination light source has a correlated color temperature of less than 5000 K and when a color rendering performance of the illumination light source is evaluated using a blackbody source as a standard source, the illumination light source has a spectral distribution in which the luminous intensities of the blue light-emitting diode, the blue-green light-emitting diode, the orange light-emitting diode and the red light-emitting diode increase in this order.

6. The illumination light source according to claim 1, wherein, when the illumination light source has a correlated color temperature of at least 5000 K and when the color rendering performance of the illumination light source is evaluated using an artificial daylight source as the standard source, the illumination light source has a spectral distribution, in which the luminous intensity of the blue light-emitting diode is higher than the luminous intensity of the blue-green light-emitting diode, and the luminous intensity of the red light-emitting diode is higher than the luminous intensity of the orange light-emitting diode.

7. The illumination light source according to claim 2, wherein, when the illumination light source has a correlated color temperature of at least 5000 K and when the color rendering performance of the illumination light source is evaluated using an artificial daylight source as the standard source, the illumination light source has a spectral distribution, in which the luminous intensity of the blue light-emitting diode is higher that the luminous intensity of the blue-green light-emitting diode, and the luminous intensity of the red light-emitting diode is higher than the luminous intensity of the orange light-emitting diode.

8. The illumination light source according to claim 6, wherein a gamut area obtained by connecting four chromaticity coordinates of special color rendering indices R9 through R12 of respective test colors rendered by the illumination light source is larger than the gamut area obtained by connecting the four chromaticity coordinates of the respective test colors rendered by the standard source.

9. The illumination source according to claim 7, wherein a gamut area obtained by connecting four chromaticity coordinates of special color rendering indices R9 through R12 of respective test colors rendered by the illumination light source is larger than the gamut area obtained by connecting the four chromaticity coordinates of the respective test colors rendered by the standard source.

10. The illumination light source according to claim 8, wherein a ratio (Ga4) of a gamut area obtained by connecting four chromaticity coordinates of special coloring rendering indices R9 through R12 of the respective test colors rendered by the illumination light source to a gamut area obtained by connecting the four chromaticity coordinates of the respective test colors rendered by the standard source is larger than a ratio (Ga) of a gamut area obtained by connecting eight chromaticity coordinates of color rendering indices R1 through R8 of respective test colors rendered by the illumination light source to a gamut area obtained by connecting the eight chromaticity coordinates of the respective test colors rendered by the standard source.

11. The illumination light source according to claim 9, wherein a ratio (Ga4) of a gamut area obtained by connecting four chromaticity coordinates of special color rendering indices R9 through R12 of the respective test colors rendered by the illumination light source to a gamut area obtained by connecting the four chromaticity coordinates of the respective test colors rendered by the standard source is larger than a ratio (Ga) of a gamut area obtained by connecting eight chromaticity coordinates of color rendering indices R1 through R8 of respective test colors rendered by the illumination light source to a gamut area obtained by connecting the eight chromaticity coordinates of the respective test colors rendered by the standard source.

12. The illumination light source according to claim 1, further comprising a phosphor that emits light when excited by emission of the light-emitting diodes.

13. The illumination light source according to claim 12, wherein the phosphor is a yellow or a green emitting phosphor that is excited by an emission of the blue light-emitting diode and emits light in a range between green and yellow; and the phosphor has an emission distribution in which a spectral half-width of the phosphor is wider than the spectral half-widths of the light-emitting diodes.

14. The illumination light source according to claim 1, further comprising a luminous intensity control means for adjusting a luminous intensity ratio of each of the four types of light emitting diodes.

15. The illumination light source according to claim 1, wherein an emitting site of the blue light-emitting diode and an emitting site of the orange light-emitting diode are provided within a single chip, and an emitting site of the red light-emitting diode and an emitting site of the blue-green light-emitting diode are provided within a single chip.

* * * * *